United States Patent
Han

(10) Patent No.: US 11,974,490 B2
(45) Date of Patent: Apr. 30, 2024

(54) APPARATUS FOR MANUFACTURING A DISPLAY DEVICE

(71) Applicant: Samsung Display Co., Ltd., Yongin-si (KR)

(72) Inventor: Jeongwon Han, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 671 days.

(21) Appl. No.: 17/107,537

(22) Filed: Nov. 30, 2020

(65) Prior Publication Data
US 2021/0336141 A1 Oct. 28, 2021

(30) Foreign Application Priority Data
Apr. 22, 2020 (KR) ........................ 10-2020-0048858

(51) Int. Cl.
*G01N 21/85* (2006.01)
*H10K 71/13* (2023.01)

(52) U.S. Cl.
CPC ........... *H10K 71/135* (2023.02); *G01N 21/85* (2013.01); *G01N 2021/8564* (2013.01)

(58) Field of Classification Search
CPC ........... G01N 2021/8564; G01N 21/85; H10K 71/135
USPC .......................................................... 29/729
See application file for complete search history.

(56) References Cited

U.S. PATENT DOCUMENTS

| | | | |
|---|---|---|---|
| 6,517,182 B1* | 2/2003 | Scardovi | B41J 2/04563 347/19 |
| 7,204,573 B2* | 4/2007 | Koyama | B41J 2/0456 347/19 |
| 8,020,960 B2* | 9/2011 | Lee | H05K 3/125 356/627 |

(Continued)

FOREIGN PATENT DOCUMENTS

| | | |
|---|---|---|
| JP | 5-149769 A | 6/1993 |
| JP | 2006-23275 A | 1/2006 |

(Continued)

OTHER PUBLICATIONS

Precitec Group; "CHRocodile CLS, Optical measuring technology, sensor"; printed from the internet on Jul. 14, 2020; https://www/precitec.de/en/products/optical-measuring-technology/line-and-multipoint-sensors/chrocodile-cls/#tab2; 2pp.

(Continued)

*Primary Examiner* — Terrell H Matthews
(74) *Attorney, Agent, or Firm* — Lewis Roca Rothgerber Christie LLP

(57) ABSTRACT

An apparatus for manufacturing a display device, the apparatus comprising: a droplet discharger comprising a nozzle configured to discharge a droplet; a first detector on a falling path of the droplet that falls from the droplet discharger and configured to detect a shape of the droplet; a second detector spaced apart from the first detector and configured to detect the shape of the droplet that falls from the droplet discharger; and a controller configured to calculate at least one of a volume of the droplet, a falling speed of the droplet, the falling path of the droplet, or a discharge angle, at which the droplet is discharged from the nozzle, based on results detected by the first detector and the second detector.

19 Claims, 13 Drawing Sheets

(56) References Cited

U.S. PATENT DOCUMENTS

| | | | | |
|---|---|---|---|---|
| 8,691,323 | B2* | 4/2014 | Von Drasek | B31F 1/14 |
| | | | | 324/634 |
| 10,551,311 | B2* | 2/2020 | Smith | G01N 21/59 |
| 2014/0313248 | A1* | 10/2014 | Tsujiguchi | B41J 2/17596 |
| | | | | 347/7 |
| 2017/0370709 | A1* | 12/2017 | Mace | G02B 21/361 |
| 2018/0257099 | A1* | 9/2018 | Miyazaki | B05C 5/0208 |
| 2021/0050270 | A1* | 2/2021 | Kim | H01L 22/12 |
| 2021/0336141 | A1* | 10/2021 | Han | H10K 71/135 |

FOREIGN PATENT DOCUMENTS

| | | | | |
|---|---|---|---|---|
| JP | 2013144274 | A | * | 7/2013 |
| KR | 10-0641378 | B1 | | 11/2006 |
| KR | 10-0975647 | B1 | | 8/2010 |
| KR | 10-1396216 | B1 | | 5/2014 |
| KR | 10-1525800 | B1 | | 6/2015 |
| KR | 10-2016-0083420 | A | | 7/2016 |
| KR | 10-1701904 | B1 | | 2/2017 |
| KR | 10-1818695 | B1 | | 1/2018 |
| KR | 10-2018-0038543 | A | | 4/2018 |
| KR | 10-2018-0064582 | A | | 6/2018 |
| KR | 10-2018-0102489 | A | | 9/2018 |
| KR | 10-2017399 | B1 | | 10/2019 |
| KR | 10-2038645 | B1 | | 10/2019 |
| KR | 20210089291 | A | * | 1/2020 |
| KR | 20210117386 | A | * | 3/2020 |
| WO | WO 2016/036646 | A1 | | 3/2016 |
| WO | WO-2016036646 | A1 | * | 3/2016 | B41J 2/04505 |
| WO | WO 2017/027566 | A1 | | 2/2017 |
| WO | WO-2017027566 | A1 | * | 2/2017 | H05G 2/005 |

OTHER PUBLICATIONS

Precitec Group; "CHRomatic Confocal Principle for Distance Measurements"; printed from the internet on Jul. 14, 2020; https://www.precitec.de/en/products/optical-measuring-technology/how-it-works; 1pp.

Saily, Juha; "Chromatic Line Confocal Sensor Technology in High-Speed 3D and Deep Depth of Focus 2D Imaging Applications"; Microsc. Microanal.; 24 (Suppl 1); 2018; 2pp.

JetXpert; "Stitch"; Drop Watcher; Capture entire drop formation in a single image; printed from the internet on Jul. 14, 2020; https://jetxpert.com/add-ons/automation/stitch/; 2pp.

Envision; "Chromatic Confocal Multi-Point"; including English translation, 5pp.

* cited by examiner

APPARATUS FOR MANUFACTURING A DISPLAY DEVICE

CROSS-REFERENCE TO RELATED APPLICATION

The present application claims priority to and the benefit of Korean Patent Application No. 10-2020-0048858, filed on Apr. 22, 2020, in the Korean Intellectual Property Office, the disclosure of which is incorporated herein in its entirety by reference.

BACKGROUND

Field

Aspects of one or more example embodiments relate to an apparatus for manufacturing a display device.

Description of Related Art

Mobile electronic apparatuses have been widely used in recent years. Recently, tablet computers have been utilized as mobile electronic apparatuses, in addition to small electronic apparatuses such as mobile phones.

Such mobile electronic apparatuses include display devices to support various functions or provide users with visual information such as images or videos. As other components for driving display devices decrease in size, areas of the electronic apparatuses that are occupied by display units tend to increase, and structures, which are bendable in a flat state to have certain angles, have been developed.

To manufacture the display devices, various layers may be formed. In this case, at least one of the layers may be formed as droplets are deposited on a substrate from a head. In this case, for accurate image representation of the display devices, the droplets may be deposited at desired positions by using the head.

The above information disclosed in this Background section is only for enhancement of understanding of the background and therefore the information discussed in this Background section does not necessarily constitute prior art.

SUMMARY

In general, when droplets are dropped on a substrate, volumes of the droplets are measured after the droplets are dropped on the substrate. In this case, it is impossible to accurately measure the volumes of the droplets, and because tables or films for experiments are required for the measurement of the volumes, significant space and costs may be utilized. One or more embodiments provide an apparatus for manufacturing a display device, in which a structure and costs are simplified, that accurately measures droplets.

Additional aspects will be set forth in part in the description which follows and, in part, will be apparent from the description, or may be learned by practice of the presented embodiments of the disclosure According to one or more embodiments, an apparatus for manufacturing a display device includes: a droplet discharger including a nozzle configured to discharge a droplet, a first detector on a falling path of the droplet that falls from the droplet discharger and configured to detect a shape of the droplet, a second detector spaced apart from the first detector and configured to detect the shape of the droplet that falls from the droplet discharger, and a controller configured to calculate at least one of a volume of the droplet, a falling speed of the droplet, the falling path of the droplet, or a discharge angle, at which the droplet is discharged from the nozzle, based on results detected by the first detector and the second detector.

According to some example embodiments, the first detector and the second detector may each include a confocal microscopy or a chromatic confocal line sensor.

According to some example embodiments, the first detector and the second detector may be arranged in opposite directions with respect to the falling path of the droplet.

According to some example embodiments, the first detector and the second detector may be configured to detect a partial shape of an outer surface of the droplet, which falls from the droplet discharger, at certain time intervals.

According to some example embodiments, the first detector and the second detector may be configured to detect a partial shape of an outer surface of the droplet that is reflected to an arbitrary plane.

According to some example embodiments, the controller may be configured to calculate an outer surface of the droplet by connecting portions other than the partial shape of the outer surface of the droplet detected by the first detector and the second detector.

According to some example embodiments, the controller may be configured to calculate a three-dimensional shape of the droplet by rotating the outer surface of the calculated droplet relative to the falling path of the droplet and to calculate a volume of the droplet by using the three-dimensional shape of the droplet.

According to some example embodiments, the controller may be configured to calculate a center of the droplet by using the three-dimensional shape of the droplet.

According to some example embodiments, the apparatus may further include a third detector spaced apart from the first detector along the falling path of the droplet, and a fourth detector opposite to the third detector with respect to the falling path of the droplet.

According to some example embodiments, the apparatus may further include a first reflector corresponding to the third detector and configured to bend laser emitted from the third detector and bend light reflected from the droplet, and a second reflector corresponding to the fourth detector and configured to bend laser emitted from the fourth detector and bend the light reflected from the droplet.

According to some example embodiments, the first detector and the second detector may be configured to detect the droplet at certain time intervals, and the controller may be configured to calculate the falling path of the droplet or a discharge angle of the droplet by connecting the center of the droplet detected by the first detector and the second detector.

According to some example embodiments, the first detector and the second detector may be configured to detect the droplet at certain time intervals when one droplet falls, and the controller may be configured to calculate a falling speed of the droplet based on a distance in which the droplet moves for a certain point in time.

According to some example embodiments, the apparatus may further include an accommodation unit configured to house a droplet discharged from the nozzle.

According to one or more embodiments, an apparatus for manufacturing a display device includes: a droplet discharger including a nozzle configured to discharge a droplet, a plurality of detectors on a falling path of the droplet that falls from the droplet discharger, and a controller configured to calculate at least one of a volume of the droplet, a falling speed of the droplet, the falling path of the droplet, or a discharge angle, at which the droplet is discharged from the nozzle, based on a detection result of the plurality of detectors.

According to some example embodiments, the plurality of detectors may each include a first detector in the falling path of the droplet falling from the droplet discharger and configured to detect a shape of the droplet, and a second detector arranged opposite to the first detector with respect to the falling path of the droplet and configured to detect a shape of the droplet falling from the droplet discharger.

According to some example embodiments, the plurality of detectors may further include a third detector spaced apart from the first detector along the falling path of the droplet, and a fourth detector opposite to the third detector with respect to the falling path of the droplet.

According to some example embodiments, the apparatus may further include a first reflector corresponding to the third detector and configured to bend laser emitted from the third detector and bend light reflected from the droplet, and a second reflector corresponding to the fourth detector and configured to bend laser emitted from the fourth detector and bend the light reflected from the droplet.

According to some example embodiments, the plurality of detectors may further include a confocal microscopy or a chromatic confocal line sensor.

According to some example embodiments, the plurality of detectors may be configured to detect a partial shape of the droplet falling from the droplet discharger at certain time intervals.

According to some example embodiments, the controller may be configured to calculate an outer surface of the droplet by connecting portions other than the partial shape of the outer surface of the droplet detected by the plurality of detectors, calculate a three-dimensional shape of the droplet by rotating the calculated outer surface of the droplet with respect to the falling path of the droplet, and calculate a volume of the droplet by using the three-dimensional shape of the droplet.

Other aspects, features, and characteristics of some example embodiments, other than those described above will become more apparent from the following detailed description, claims and drawings for carrying out the disclosure.

BRIEF DESCRIPTION OF THE DRAWINGS

The above and other aspects, features, and characteristics of certain example embodiments of the disclosure will be more apparent from the following description taken in conjunction with the accompanying drawings, in which.

DETAILED DESCRIPTION

Figure 1:
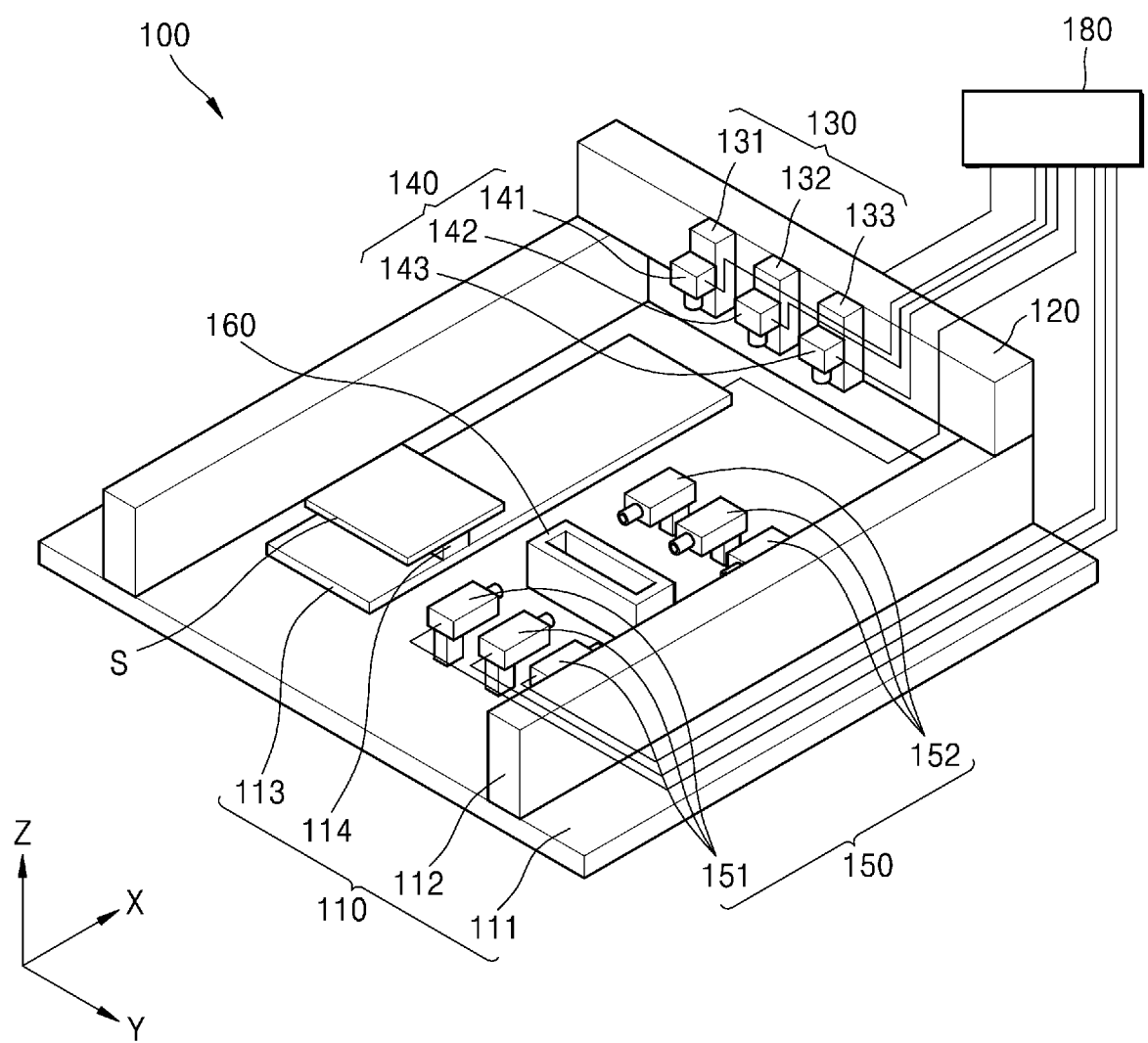
FIG. 1 is a schematic perspective view of an apparatus for manufacturing a display device, according to some example embodiments.

Reference will now be made in more detail to aspects of some example embodiments, which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, particular embodiments will be illustrated in the drawings and described in more detail in the written description. The attached drawings for illustrating example embodiments according to the present disclosure are referred to in order to gain a sufficient understanding of the present disclosure, the merits thereof, and the objectives accomplished by the implementation of the present disclosure. The disclosure may, however, be embodied in many different forms and should not be construed as being limited to the embodiments set forth herein.

It will be understood that although the terms "first," "second," etc. may be used herein to describe various components, these components should not be limited by these terms. These components are only used to distinguish one component from another.

As used herein, the singular forms "a," "an," and "the" are intended to include the plural forms as well, unless the context clearly indicates otherwise.

It will be further understood that the terms comprises and/or comprising used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

Sizes of components in the drawings may be exaggerated for convenience of explanation. In other words, because sizes and thicknesses of components in the drawings are arbitrarily illustrated for convenience of explanation, the following embodiments are not limited thereto.

According to some example, an expression such as "A and/or B" indicates A, B, or A and B. Also, an expression such as "at least one of A and B" indicates A, B, or A and B.

In the example embodiments described below, the description that lines extend "in a first direction or a second direction" includes that the lines extend in a straight line and includes that the lines extend in a zigzag shape or a curved line along a first direction or a second direction.

In the embodiments described below, when a component is referred to as being "on a plane," it is understood that a component is viewed from the top, and when a component is referred to as being "on a cross-section," it is understood that the component is vertically cut and viewed from the side. In embodiments below, when components "overlap" each other, the components overlap "on a plane" and "on a cross-section."

Hereinafter, aspects of some example embodiments of the disclosure will be described in more detail with reference to the attached drawings, and like reference numerals in the drawings denote like reference elements.

Figure 2:
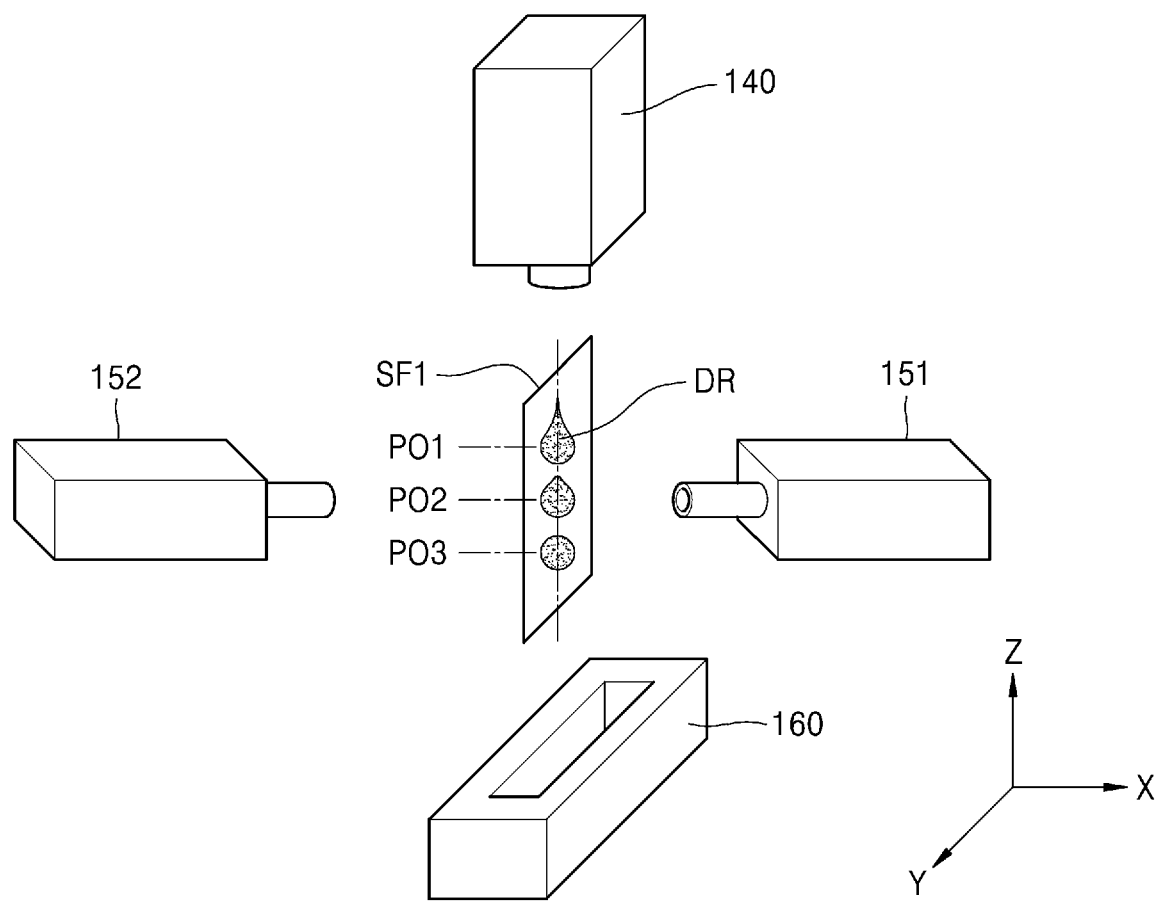
FIG. 2 is a schematic perspective view of part of an apparatus for manufacturing a display device, according to some example embodiments.

FIG. 1 is a schematic perspective view of an apparatus for manufacturing a display device, according to some example embodiments, and FIG. 2 is a schematic perspective view of part of an apparatus for manufacturing a display device, according to some example embodiments.

Referring to FIGS. 1 and 2, an apparatus 100 for manufacturing a display device may include a support 110, gantries 120, a moving unit 130, a droplet discharger 140, first detectors 151, second detectors 152, an accommodation unit 160, and a controller 180.

The support 110 may include a stage 111, guide members 112, a substrate movement member 113, and a substrate rotation member 114. The stage 111 may include an align mark for aligning a display substrate S.

The display substrate S may be a substrate used by a display device being manufactured. The display substrate S may include glass or polymer resin such as polyether sulfone, polyarylate, polyether imide, polyethylene naphthalate, polyethylene terephthalate, polyphenylene sulfide, polyimide, polycarbonate (PC), cellulose triacetate (TAC), or cellulose acetate propionate.

The guide members 112 may be spaced apart from each other on both sides of the stage 111 with the substrate movement member 113 therebetween. A length of the guide member 112 may be greater than a length of an edge of the display substrate S. In this case, the length of the guide member 112 and the length of the edge of the display substrate S may be measured in an x direction of FIG. 1.

According to some example embodiments, the gantry 120 may be located on the guide members 112. According to some example embodiments, the guide member 112 may include a certain rail to enable the gantry 120 to linearly move in a lengthwise direction of the guide member 112. For example, the guide member 112 may include a linear motion rail.

The substrate movement member 113 may be arranged on the stage 111. The substrate movement member 113 may extend in the lengthwise direction of the guide member 112. For example, referring to FIG. 1, the substrate movement member 113 may extend in the x direction. Also, the substrate movement member 113 may include a rail to enable the substrate rotation member 114 to linearly move. For example, the substrate movement member 113 may include a linear motion rail.

The substrate rotation member 114 may be arranged to rotate on the substrate movement member 113. When the substrate rotation member 114 rotates, the display substrate S arranged on the substrate rotation member 114 may rotate. According to some example embodiments, the substrate rotation member 114 may rotate on a rotation axis that is perpendicular to one surface of the stage 111 on which the display substrate S is located. When the substrate rotation member 114 rotates on the rotation axis perpendicular to one surface of the stage 111 on which the display substrate S is arranged, the display substrate S, which is arranged on the substrate rotation member 114, may also rotate on the rotation axis perpendicular to the surface of the stage 111 on which the display substrate S is located. In this case, the substrate rotation member 114 may fix the display substrate S after the display substrate S is arranged on the substrate rotation member 114. For example, the substrate rotation member 114 may include one of a vacuum chuck, an electrostatic chuck, and an adhesive chuck.

The gantry 120 may be arranged on the guide member 112. That is, the gantries 120 may be arranged on the guide members 112 that are spaced apart from each other with the substrate movement member 113 therebetween.

The gantry 120 may move in the lengthwise direction of the guide member 112. According to some example embodiments, the gantry 120 may linearly move in a manual manner or in an automatic manner by further including a motor cylinder, etc. For example, the gantry 120 may automatically linearly move because of a linear motion block of the gantry 120 that moves along the motion rails.

The moving unit 130 may linearly move on the gantry 120. For example, the gantry 120 may include a certain rail to enable the moving unit 130 to linearly move. In this case, the droplet discharger 140 may be arranged on the moving unit 130 and move along with the moving unit 130 while the moving unit 130 moves.

The moving unit 130 and the droplet discharger 140 may be arranged in various manners. For example, the moving unit 130 and the droplet discharger 140 may each be provided in singular. In this case, the droplet discharger 140 may include one head and at least one nozzle arranged on the head and discharging a droplet DR.

According to some example embodiments, the droplet discharger 140 may be provided in plural, and the moving unit 130 may be provided in singular. In this case, the droplet dischargers 140 may be located on a single moving unit 130 and may simultaneously move according to a movement of the moving unit 130. In this case, the droplet discharger 140 may include at least one head including at least one nozzle.

According to some example embodiments, the moving unit 130 and the droplet discharger 140 may each be provided in plural. In this case, one droplet discharger 140 or some of the droplet dischargers 140 may be located on one moving unit 130, and the others thereof may be located on another moving unit 130.

Hereinafter, for convenience, a case where one droplet discharger 140 is located on one moving unit 130 will be mainly described.

The moving unit 130 may include multiple moving units. In this case, the number of moving units 130 may correspond to that of the droplet dischargers 140. For example, the moving unit 130 may include a first moving unit 131, a second moving unit 132, and a third moving unit 133.

The first moving unit 131 and the second moving unit 132 may be apart from each other, and the second moving unit 132 and the third moving unit 133 may be apart from each other. A gap between the first moving unit 131 and the second moving unit 132 may be identical to a gap between the second moving unit 132 and the third moving unit 133. According to some example embodiments, the gap between the first moving unit 131 and the second moving unit 132 may differ from the gap between the second moving unit 132 and the third moving unit 133. In the above case, the first to third moving units 131 to 133 may separately move.

The moving unit 130 may linearly move on the gantry 120. For example, the moving unit 130 may move in the lengthwise direction of the gantry 120. For example, at least one of the first to third moving units 131 to 133 may move in a +Y direction or a −Y direction.

According to some example embodiments, the moving unit 130 may linearly move in a manual manner. According to some example embodiments, the moving unit 130 may linearly move in an automatic manner by including a motor, a cylinder, etc. For example, the moving unit 130 may include a linear motion block that moves along the linear motion rail.

The droplet discharger 140 may be located on the moving unit 130. For example, a first droplet discharger 141 may be located on the first moving unit 131. As another example, a second droplet discharger 142 may be located on the second moving unit 132. As another example, a third droplet discharger 143 may be located on the third moving unit 133.

The droplet discharger 140 may discharge the droplet DR to the display substrate S or the accommodation unit 160. In this case, the droplet DR may be a liquid crystal, an alignment liquid, or red, green, and blue inks in which pigments are mixed with a solvent. According to some example embodiments, the droplet DR may be a high molecular weight organic material or a low molecular weight organic material that corresponds to an emission layer of an organic light-emitting display device. According to some example embodiments, the droplet DR may include a solution including inorganic particles such as quantum dots.

The amount of droplets DR provided respectively by the first to third droplet dischargers 141 to 143 may be adjusted. In this case, the first to third droplet dischargers 141 to 143 may be electrically connected to the controller 180, respectively. Therefore, the amount of droplets DR discharged from the first to third droplet dischargers 141 to 143 may be respectively adjusted by the controller 180. In the above case, at least one of the first to third droplet dischargers 141 to 143 may include at least one nozzle discharging one droplet DR. In this case, when there are multiple nozzles, at least one of the nozzles may provide the droplet DR into an opening 190P described below with reference to FIG. 18.

For example, one nozzle may provide the droplet DR in one opening 19OP. According to some example embodiments, at least two nozzles may provide the droplets DR in one opening 19OP.

The detector 150 may detect and measure a shape of the droplet DR discharged from the droplet discharger 140. For example, the detector 150 may detect and measure a partial shape of an outer surface of the droplet DR discharged from the droplet discharger 140 or may detect and measure a partial shape of a cross-section of the droplet DR discharged from the droplet discharger 140. The detector 150 may be provided in plural. For example, the detector 150 may include a first detector 151 and a second detector 152. The first detector 151 and the second detector 152 may be in parallel with each other and spaced apart from each other in an X direction.

The detector 150 may have various shapes. For example, the detector 150 may include a confocal microscopy, an interferometric microscope, or a chromatic confocal line sensor. In this case, the confocal microscope may be used to obtain two-dimensional images of an object that have different depths and reconstruct a three-dimensional structure based on the two-dimensional images. Examples of the confocal microscope may include a chromatic confocal microscope, a chromatic line confocal microscope, and the like. The interferometric microscope may be used to examine a change in fine structure irregularities, a phase change, and the like and measure a fixed quantity. Examples of the interferometric microscope may include a laser interferometric microscope, a white light interferometric microscope, and the like. Hereinafter, for convenience, a case where the detector 150 includes a chromatic line confocal microscope will be mainly described.

The first detector 151 may be provide in singular and thus detect multiple droplets DR. According to some example embodiments, the first detector 151 may be provided in plural, and one first detector 151 may be arranged corresponding to one droplet discharger 140 and detect the droplets DR discharged from one droplet discharger 140. According to some example embodiments, the first detector 151 may be provided in plural, and some of the first detectors 151 may detect at least one droplet DR discharged from some of the droplet dischargers 140, and others of the first detectors 151 may detect at least one droplet DR discharged from others of the droplet dischargers 140.

Also, the second detector 152 may be provided in singular and detect the droplets DR at a time. According to some example embodiments, the second detector 152 may be provided in plural, and one second detector 152 may be arranged corresponding to one droplet discharger 140 and detect the droplet DR discharged from one droplet discharger 140. According to some example embodiments, the second detector 152 may be provided in plural, and some of the second detectors 152 may detect at least one droplet DR discharged from some of the droplet dischargers 140, and others of the second detectors 152 may detect at least one droplet DR discharged from others of the droplet dischargers 140.

The accommodation unit 160 may be located between the guide members 112. In this case, the accommodation unit 160 may temporarily store the droplet DR when the droplet DR falling from the droplet discharger 140 is measured. The accommodation unit 160 may be located on the stage 111. According to some example embodiments, the accommodation unit 160 may be located on a lower surface of the stage 111. In this case, a hole may be formed in a portion of the stage 111 on which the accommodation unit 160 is located.

The controller 180 may calculate at least one of a three-dimensional shape of the droplet DR, a falling speed of the droplet DR, a falling path of the droplet DR, or a discharge angle of the droplet DR, based on a measurement result of the detector 150. Also, the controller 180 may entirely control the apparatus 100 for manufacturing the display device.

The apparatus 100 for manufacturing a display device above may provide the droplets DR to the display substrate S and form an organic layer on the display substrate S. In this case, it is required to accurately discharge the droplets DR, which are discharged from the apparatus 100, onto the display substrate S. To this end, while the droplets DR are discharged to the accommodation unit 160 after each droplet discharger 140 is arranged corresponding to the accommodation unit 160, the droplets DR may be detected by the first and second detectors 151 and 152. According to some example embodiments, each droplet discharger 140 may discharge the droplets DR to the display substrate S, and the first and second detectors 151 and 152 may detect the droplets DR. According to some example embodiments, the droplets DR may be provided from the droplet discharger 140 to a test substrate, which has the same shape as the display substrate S and is located on a support plate that is separately located on a portion where the substrate rotation member 114 or the accommodation unit 160 is located, and the droplets DR may also be detected by the first and second detectors 151 and 152. However, for convenience, a case where the droplet discharger 140 discharges the droplets DR to the accommodation unit 160 and where the first and second detectors 151 and 152 may detect the droplets DR will be mainly described.

The first and second detectors 151 and 152 may detect the droplets DR discharged from the droplet discharger 140 to the accommodation unit 160. The first and second detectors 151 and 152 may be located in falling paths of the droplets DR falling from the droplet discharger 140. Also, the first and second detectors 151 and 152 may be located opposite to each other with respect to the falling paths of the droplets DR. For example, the first and second detectors 151 and 152 may be apart from each other in the X direction.

The first and second detectors 151 and 152 may detect partial shapes of outer surfaces of the discharge droplets DR. For example, the detector 150 may detect irradiations of laser onto a first plane SF1, which is parallel to a Y-Z plane of FIG. 2 from among the shapes of the outer surfaces of the droplets DR, and reflection of the laser from the droplets DR.

For example, positions of the droplets DR falling from the droplet discharger 140 may vary according to time. For example, the droplet DR, which is located at a first position PO1 as a first point in time has passed after the droplet DR falls from the droplet discharger 140, may have a long tail because of attraction to the nozzle of the droplet discharger 140. Also, the droplet DR, which is located at a second position PO2 as a second point in time has passed right after the droplet DR falls from the droplet discharger 140, may have a shorter tail than the droplet DR located at the first position PO1. The droplet DR, which is located at a third position PO3 as a third point in time has passed right after the droplet DR falls from the droplet discharger 140, may have a shorter tail than the droplet DR located at the second position PO2. Thus, a shape of the tail may be almost a sphere.

As described above, the first and second detectors 151 and 152 may detect the droplets DR in first, second, and third points in time. In this case, a time interval, in which the droplets DR start falling from the droplet discharger 140, the first point in time, an interval between the first point in time and the second point in time, and an interval between the second point in time and the third point in time may be identical to each other. That is, the first and second detectors 151 and 152 may detect the positions of the falling droplets DR according to time by detecting the droplets DR at certain time intervals. FIG. 2 shows that the first and second detectors 151 and 152 may detect the droplets DR from the first point in time to the third point in time, but one or more embodiments are not limited thereto. The first and second detectors 151 and 152 may detect the droplets DR for multiple points in time. For example, the first and second detectors 151 and 152 may detect the droplets DR from the first point in time to a tenth point in time, detect the droplets DR from the first point in time to a twentieth point in time, and detect the droplets DR from the first point in time to an $N^{th}$ point in time (where, N is a natural number).

As described above, the controller 180 may calculate a three-dimensional shape of the droplet DR based on the partial shape of the outer surface of the droplet DR. In this case, the controller 180 may calculate a volume of the droplet DR based on the three-dimensional shape of the droplet DR. Also, the controller 180 may calculate the falling paths of the droplets DR based on the positions of the droplets DR detected by the first and second detectors 151 and 152 according to each point in time. The controller 180 may calculate the discharge angle of the droplet DR by connecting the falling path of the droplet DR to an initial point, at which the droplet DR is discharged, and by calculating an angle formed by a lengthwise direction of the nozzle of the droplet discharger 140 and the falling path. The controller 180 may calculate the discharge speed of the droplet DR based on a position of the droplet DR according to each time.

The controller 180 may control at least one of the droplet discharger 140 or the moving unit 130, based on at least one of the volume, the falling path, the discharge angle, or the discharge speed of the droplet DR.

For example, the controller 180 may control an amount or the discharge speed of droplets DR discharged from the droplet discharger 140. Also, the controller 180 may enable the droplets DR to be located at desired positions by varying a location of the droplet discharger 140 by using the moving unit 130 and by adjusting the discharge angle and the falling path of the droplets DR. According to some example embodiments, the controller 180 may cleanse the droplet discharger 140 according to the discharge angle or the falling path of the droplet DR or control a movement speed of the display substrate S or a movement speed of the droplet discharger 140. The above-described control method will be described below in more detail.

Hereinafter, a method of measuring the falling path, the falling speed, the discharge angle, and the volume of the droplet DR will be described in more detail.

Figure 3:
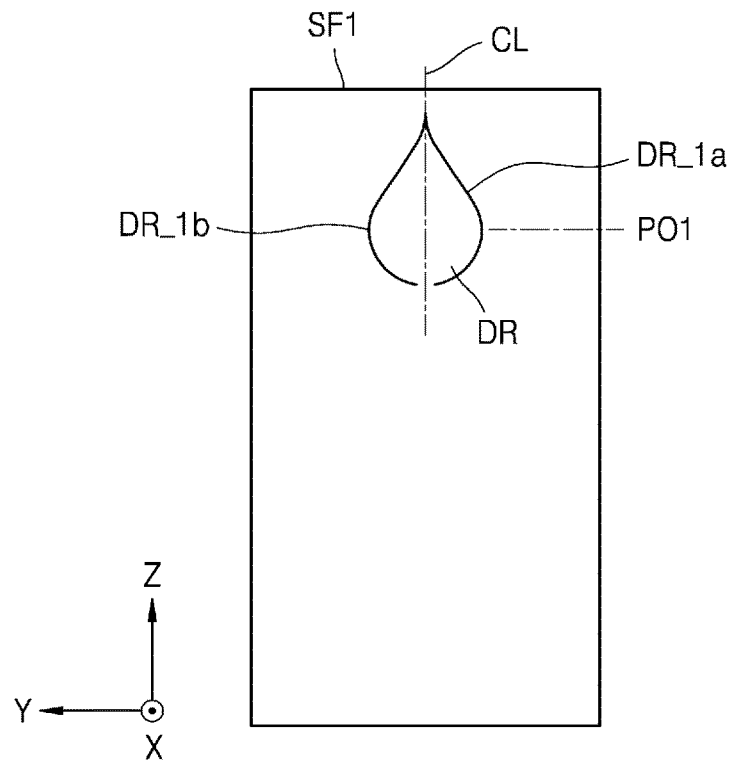
FIG. 3 is a schematic plan view of a partial shape of a droplet at a first position of FIG. 2.
Figure 4:
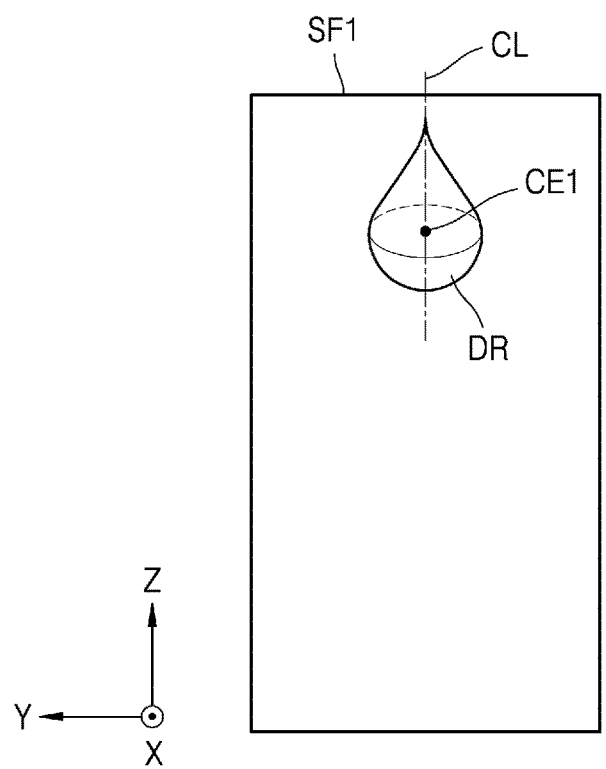
FIG. 4 is a schematic perspective view of a three-dimensional shape of a droplet that is calculated using the partial shape of the droplet of FIG. 3.

FIG. 3 is a schematic plan view of a partial shape of the droplet DR at the first position PO1 of FIG. 2, and FIG. 4 is a schematic perspective view of a three-dimensional shape of a droplet that is calculated using the partial shape of the droplet DR of FIG. 3.

Referring to FIGS. 3 and 4, when the droplet DR is located at the first position PO1 as the first point in time has passed after the droplet DR is discharged from the droplet discharger 140, the first and second detectors 151 and 152 may detect part of the droplet DR located at the first position PO1 of the first plane SF1. In this case, as ranges of laser beams emitted from the first and second detectors 151 and 152 differ according to colors of the laser beams, the first and second detectors 151 and 152 may detect wavelengths of the laser beams, which are reflected from the droplets DR and return to the first and second detectors 151 and 152, and may detect a distance from the first and second detectors 151 and 152 to the outer surface of the droplet DR. In this case, the first and second detectors 151 and 152 may be arranged in a direction perpendicular to the falling path of the droplets DR. That is, the first and second detectors 151 and 152 may be located on side surfaces of the falling paths of the droplets DR (e.g., the X direction of FIG. 3). Also, the first and second detectors 151 and 152 may be arranged at opposite sides with respect to the falling paths of the droplets DR. For example, when the first detector 151 is arranged in the +X direction with respect to the falling paths of the droplets DR, the second detector 152 may be arranged in the –X direction.

As shown in FIG. 3, the first and second detectors 151 and 152 may include the falling paths of the droplets DR or may detect portions of the outer surfaces of the droplets DR located on the first plane SF1 parallel to the falling paths of the droplets DR. In more detail, the first detector 151 may detect part of an outer surface DR_1a of the droplet DR located on the first plane SF1, and the second detector 152 may detect part of an outer surface DR_1b of the droplet DR located on the first plane SF1.

The outer surface DR_1a detected by the first detector 151 and the outer surface DR_1b of the droplet DR detected by the second detector 152 may be symmetrical to each other with respect to a central line CL. According to some example embodiments, shapes of the outer surface DR_1a detected by the first detector 151 and the outer surface DR_1b of the droplet DR detected by the second detector 152 may be different from each other with respect to the central line CL. In this case, the central line CL may be an arbitrary line that is parallel to a straight line perpendicular to one surface of the display substrate S to which the droplet DR is discharged, may be a straight line that is identical or parallel to the falling path of the droplet DR, or may be a straight line that is formed by connecting both ends of the portions of the outer surfaces of the droplets DR detected by the first and second detectors 151 and 152. For example, the central line CL may be an arbitrary straight line that is in a Z-axis direction or parallel to the Z-axis direction.

When a shape of an outer surface of the droplet DR is detected by the first detector 151 and the shape is equal to or greater than a certain angle, the shape may be no longer detected. For example, when a case where the first detector 151 is perpendicular to the shape of the outer surface of the droplet DR is 0 degrees, the shape of the outer surface of the droplet DR may not be detected when an angle, which is formed by the first detector 151 and the shape of the outer surface of the droplet DR, is equal to or greater than 75 degrees or 85 degrees.

Also, when the shape of the outer surface of the droplet DR is detected by using the second detector 152, the shape of the outer surface of the droplet DR may not be detected when the shape has an angle equal to or greater than a certain range. For example, when a case where the second detector 152 is perpendicular to the shape of the outer surface of the droplet DR is 0 degrees, the shape of the outer surface of the droplet DR may not be detected when the angle, which is formed by the second detector 152 and the shape of the outer surface of the droplet DR, is equal to or greater than 75 degrees or 85 degrees.

Therefore, the controller 180 of the apparatus 100 according to some example embodiments may calculate the outer surface of the droplet DR by connecting portions other than the partial shapes of the outer surfaces DR_1a and DR_1b of the droplets DR detected by the first and second detectors 151 and 152. For example, the controller 180 may calculate the shape of the outer surface of the droplet DR by connecting portions, which are not detected by the first and second detectors 151 and 152 from among the partial shapes of the outer surfaces of the droplets DR, to each other with respect to the central line CL. In this case, the portions, which are not detected by the first and second detectors 151 and 152 from among the partial shapes of the outer surfaces of the droplets DR, are connected to each other in a straight line or in a curved line by calculating a center of the droplet DR.

The controller 180 may calculate the three-dimensional shape of the droplet DR by using the calculated shape of the droplet DR. For example, the controller 180 may calculate the three-dimensional shape of the droplet DR by rotating the calculated outer surface of the droplet DR relative to the central line CL. The controller 180 may store the three-dimensional shape of the droplet DR described above. In this case, the controller 180 may calculate a first center CE1 of the droplet DR. In this case, the first center CE1 may be a center of gravity of the three-dimensional shape of the droplet DR, a geometric center of the three-dimensional shape, or the like.

As described above, the controller 180 may calculate a position of the droplet DR on X, Y, and Z axes of FIG. 2 relative to a virtual point at which the X, Y, and Z axes of FIG. 2 cross. For example, the controller 180 may set a center of an end of the nozzle of the droplet discharger 140, from which the droplet DR falls, as a reference point and may compare the center with the calculated first center CE1 of the droplet DR, thereby identifying how much the first center CE1 of the droplet DR is moved from the reference point in X-axis, Y-axis, and Z-axis directions. In this case, the controller 180 may calculate a distance from the reference point to the first center CE1 of the droplet DR in the Y-axis direction. Also, after the first center CE1 of the droplet DR is calculated based on detection results of the first and second detectors 152 and 153, the controller 180 may calculate a distance from the reference point to the first center CE1 of the droplet DR in the X-axis direction. Also, the controller 180 may calculate a distance between the first center CE1 of the droplet DR, which is calculated in the Z direction, and the reference point. The controller 180 may calculate each distance as described above and then may calculate and store X, Y, and Z coordinates of the first center CE1 of the droplet DR with respect to the reference point.

Figure 5:
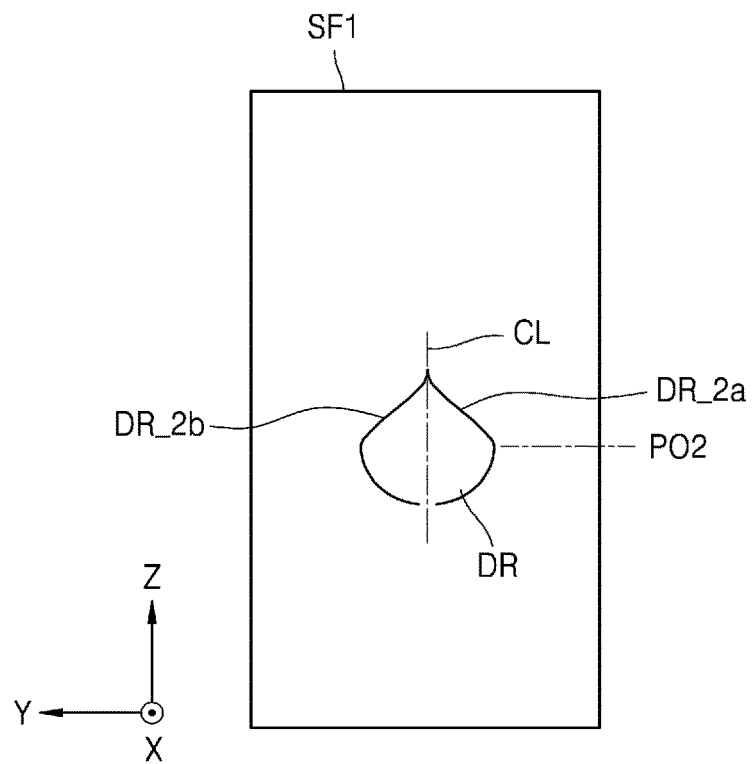
FIG. 5 is a schematic plan view of a partial shape of a droplet at a second position of FIG. 2.
Figure 6:
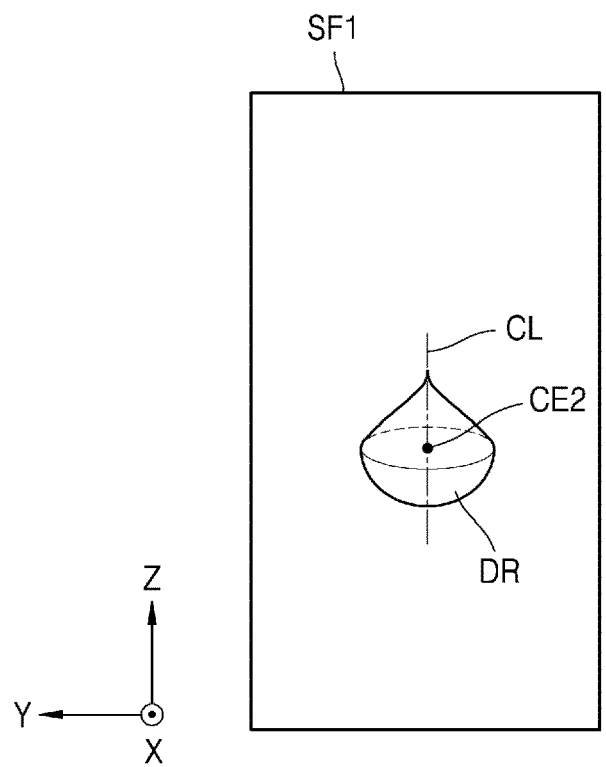
FIG. 6 is a schematic perspective view of a three-dimensional shape of a droplet that is calculated using the partial shape of the droplet of FIG. 5.

FIG. 5 is a schematic plan view of a partial shape of a droplet at the second position PO2 of FIG. 2, and FIG. 6 is a schematic perspective view of a 3D shape of a droplet that is calculated using the partial shape of the droplet of FIG. 5.

Referring to FIGS. 5 and 6, when the second point in time comes after the droplet DR is discharged, the droplet DR may be falling further from the first point PO1 and may be located at the second position PO2. The first detector 151 and the second detector 152 may detect the droplet DR located at the second position PO2. In this case, a method whereby the first detector 151 and the second detector 152 detect the droplet DR may be the same as described above. In this case, a first plane SF1, on which some surfaces of the droplet DR detected by the first and second detectors 151 and 152 are formed, may be a plane that is the same as or parallel to the first plane SF1 of FIGS. 3 and 4.

As shown in FIG. 5, the first detector 151 and the second detector 152 may include the falling path of the droplet DR or may detect a portion of the outer surface of the droplet DR located on the first plane SF1 parallel to the falling path of the droplet DR. In more detail, the first detector 151 may detect part of an outer surface DR_2a of the droplet DR located on the first plane SF1, and the second detector 152 may detect part of an outer surface DR_2b of the droplet DR located on the first plane SF1.

The outer surface DR_2a detected by the first detector 151 and the outer surface DR_2b detected by the second detector 152 may be symmetrical to each other with respect to the above-described center line CL. According to some example embodiments, shapes of the outer surface DR_2a detected by the first detector 151 and the outer surface DR_2b detected by the second detector 152 may be different from each other with respect to the center line CL.

The controller 180 may calculate an outer surface of the droplet DR by connecting portions other than the partial shapes of the outer surfaces DR_2a and DR_2b of the droplet DR detected by the first and second detectors 151 and 152. For example, the controller 180 may calculate the shapes of the outer surfaces of the droplet DR by connecting the portions, which are not detected by the first and second detectors 151 and 152 from among the partial shapes of the outer surfaces of the droplet DR, with respect to the central line CL. In this case, the portions, which are not detected by the first and second detectors 151 and 152 from among the partial shapes of the outer surfaces of the droplet DR, may be connected in a straight line or in a curved line by calculating the center of the droplet DR.

The controller 180 may calculate the 3D shape of the droplet DR by using the calculated outer surfaces of the droplet DR. In more detail, the controller 180 may calculate the 3D shape of the droplet DR by rotating the calculated outer surfaces of the droplet DR relative to the aforementioned central line CL. The controller 180 may store the above 3D shape of the droplet DR. In this case, the controller 180 may calculate a second center CE2 of the droplet DR. In this case, the second center CE2 may be a center of gravity of a 3D shape of the droplet DR, a geometric center of the 3D shape, or the like.

The controller 180 may set a center of an end of the nozzle of the droplet discharger 140, from which the droplet DR falls, as a reference point and compare the center with the calculated second center CE2 of the droplet DR, thereby identifying how much the second center CE2 of the droplet DR is moved from the reference point in X-axis, Y-axis, and Z-axis directions. In this case, the controller 180 may calculate a distance from the reference point to the second center CE2 in the Y-axis direction. Also, after the second center CE2 of the droplet DR is calculated based on detection results of the first and second detectors 151 and 152, the controller 180 may calculate the distance between the second center CE2 of the droplet DR and the reference point in the X-axis direction. Also, the controller 180 may calculate the distance between the second center CE2 of the droplet DR and the reference point in the Z-axis direction. The controller 180 may calculate each distance as described above and may calculate and store X, Y, and Z coordinates of the second center CE2 of the droplet DR with respect to the reference point.

Figure 7:
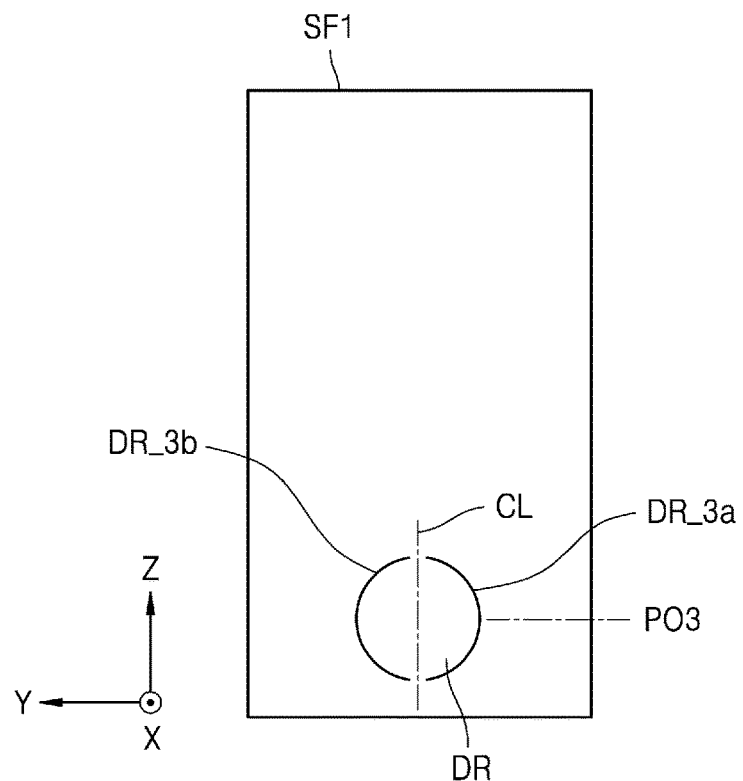
FIG. 7 is a schematic plan view of a partial shape of a droplet at a third position of FIG. 2.
Figure 8:
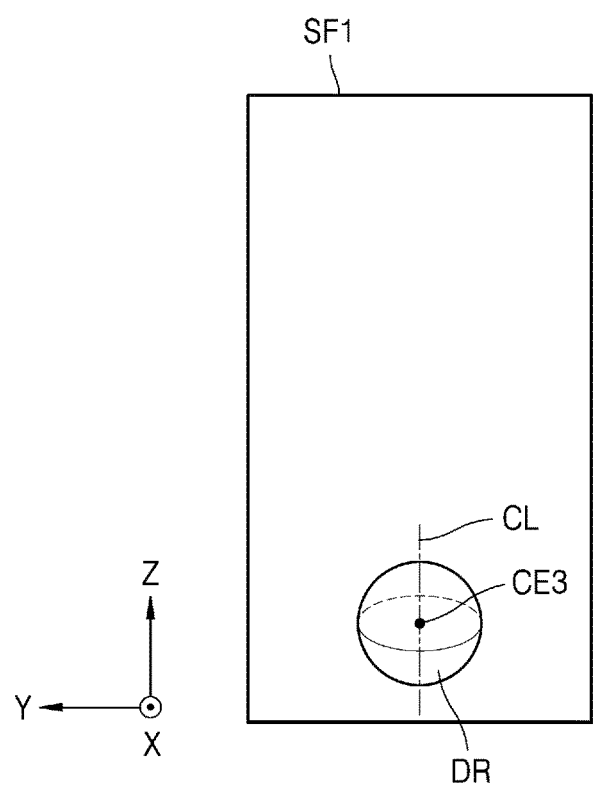
FIG. 8 is a schematic perspective view of a three-dimensional shape of a droplet that is calculated using the partial shape of the droplet of FIG. 7.
Figure 9:
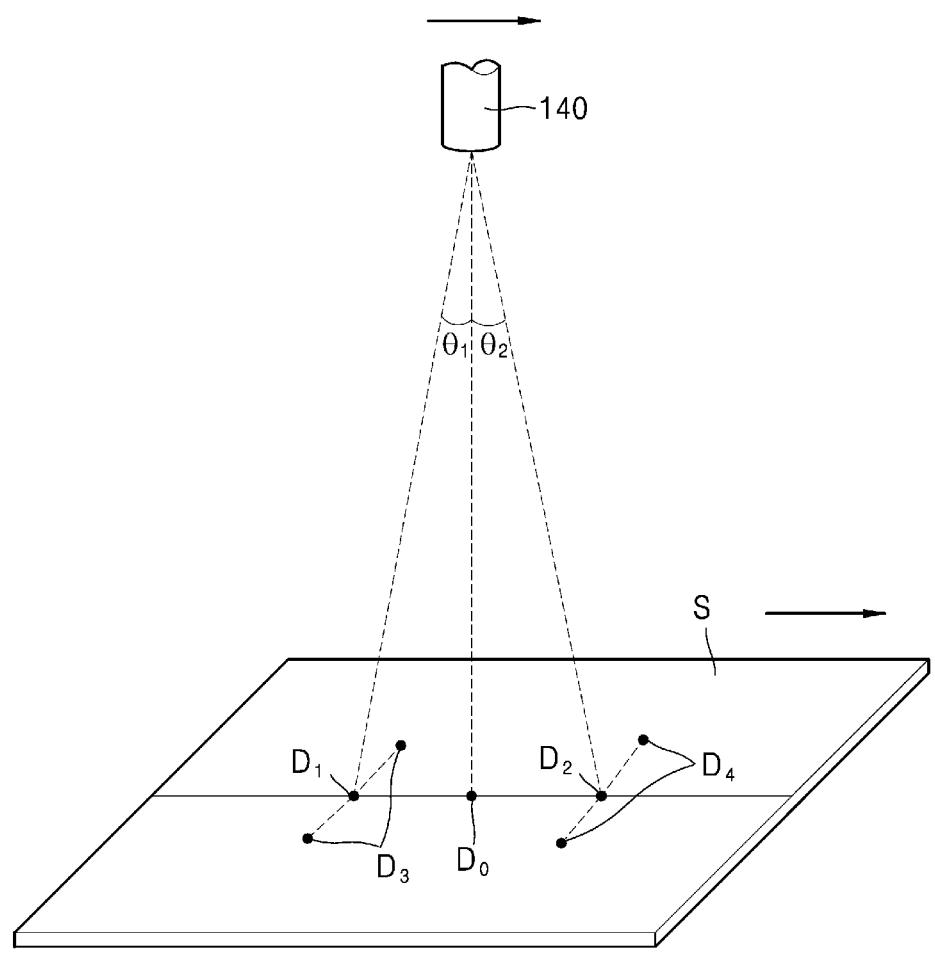
FIG. 9 is a schematic perspective view of a falling path of a droplet discharged from a droplet discharger of FIG. 2 and a point of a display substrate where the droplet is dropped.

FIG. 7 is a schematic plan view of a partial shape of a droplet at a third position of FIG. 2, FIG. 8 is a schematic perspective view of a 3D shape of a droplet that is calculated through the partial shape of the droplet of FIG. 7, and FIG. 9 is a schematic perspective view of a falling path of a droplet discharged from a droplet discharger of FIG. 2 and a point of a display substrate where the droplet is dropped.

Referring to FIGS. 7 and 8, when a third point in time comes after the droplet DR is discharged, the droplet DR may fall further from the second position PO2 and may be located at the third position PO3. The first and second detectors 151 and 152 may detect a droplet DR located at a third position PO3. In this case, a method whereby the first and second detectors 151 and 152 detect the droplets DR may be the same as described above. In this case, the first plane SF1, on which some surfaces of the droplet DR detected by the first and second detectors 151 and 152 are formed, may be the same as the first plane SF1 shown in FIGS. 3 and 4 or parallel thereto.

As shown in FIG. 7, the first and second detectors 151 and 152 may include the falling path of the droplet DR or may detect a portion of the outer surface of the droplet DR located on the first plane SF1 that is parallel to the falling path of the droplet DR. In more detail, the first detector 151 may detect a portion of an outer surface DR_3a of the droplet DR located on the first plane SF1, and the second detector 152 may detect a portion of an outer surface DR_3b of the droplet DR located on the first plane SF1.

The outer surface DR_3a detected by the first detector 151 and the outer surface DR_3b detected by the second detector 152 may be symmetrical to each other with respect to the above-described center line CL. According to some example embodiments, shapes of the outer surface DR_3a detected by the first detector 151 and the outer surface DR_3b detected by the second detector 152 may be different from each other with respect to the above-described center line CL.

The controller 180 may calculate the outer surface of the droplet DR by connection portions other than the partial shapes of the outer surfaces DR_3a and DR_3b of the droplet DR detected by the first and second detectors 151 and 152. For example, the controller 180 may calculate the outer surface of the droplet DR by connecting the portions, which are not detected by the first and second detectors 151 and 152 from among the partial shapes of the outer surfaces of the droplet DR, with respect to the central line CL. In this case, the portions, which are not detected by the first and second detectors 151 and 152 from among the partial shapes of the outer surfaces of the droplet DR, may be connected in a straight line or in a curved line by calculating the center of the droplet DR.

The controller 180 may calculate the 3D shape of the droplet DR by using the calculated outer surfaces of the droplet DR. In more detail, the controller 180 may calculate the 3D shape of the droplet DR by rotating the calculated outer surfaces of the droplet DR relative to the aforementioned central line CL. The controller 180 may store the above 3D shape of the droplet DR. In this case, the controller 180 may calculate a third center CE3 of the droplet DR. In this case, the third center CE3 may be a center of gravity of a 3D shape of the droplet DR, a geometric center of the 3D shape, or the like. In this case, the 3D shape of the droplet DR at the third position PO3 may be identical or similar to a sphere.

As described above, the controller 180 may set a center of an end of the nozzle of the droplet discharger 140, from which the droplet DR falls, as a reference point and compare the center with the calculated third center CE3 of the droplet DR, thereby identifying how much the third center CE3 of the droplet DR is moved from the reference point in X-axis, Y-axis, and Z-axis directions. In this case, the controller 180 may calculate a distance from the reference point to the third center CE3 in the Y-axis direction. Also, after the third center CE3 of the droplet DR is calculated based on detection results of the first and second detectors 151 and 152, the controller 180 may calculate the distance between the third center CE3 of the droplet DR and the reference point in the X-axis direction. Also, the controller 180 may calculate the distance between the third center CE3 of the droplet DR and the reference point in the Z-axis direction. The controller 180 may calculate each distance as described above and may calculate and store X, Y, and Z coordinates of the third center CE3 of the droplet DR with respect to the reference point.

As described above, the controller 180 may calculate the 3D shapes of the droplet DR at the first position PO1, the second position PO2, and the third position PO3 and may calculate the volume of the droplet DR at respective positions by using the calculated 3D shapes. For example, the controller 180 may calculate the volume of the 3D shape of the droplet DR at each position by calculating a volume of the droplet DR at each position. In this case, a volume, which is the greatest among the calculated volumes, may be a volume of the droplet DR discharged from the droplet discharger 140.

In the embodiments of FIGS. 2 to 8, for convenience, the volumes of the droplet DR at the first to third positions PO1 to PO3 are calculated, and the volume of the droplet DR discharged from the droplet discharger 140 is calculated. However, one or more embodiments are not limited thereto. The droplet DR is detected at multiple positions by using the first and second detectors 151 and 152, and the volume of the droplet DR is calculated at each position. Thus, the volume of the droplet DR discharged from the droplet discharger 140 may be calculated.

The apparatus for manufacturing a display device according to some example embodiments may detect the droplet DR by using the first and second detectors 151 and 152 and thus may accurately and precisely detect the droplet DR discharged from the droplet discharger 140.

Also, by calculating the outer surface of the droplet by connecting the shape of the outer surface of the droplet that is not detected by the detector, a shape, a volume, a discharge angle, a discharge speed, and the like of the droplet may be accurately measured or calculated.

The controller 180 may calculate the falling speed of the droplet DR based on a point in time in which the droplet DR is moved from each position to another position, and a distance between moved positions That is, the controller 180 may calculate the falling speed of the droplet DR based on a distance from the end of the nozzle of the droplet discharger 140 to the first position PO1 in the Z-axis direction, and a time taken to move such a distance. Also, the controller 180 may calculate the falling speed of the droplet DR based on a distance between the first position PO1 and the second position PO2 in the Z-axis direction, and a time taken when the droplet DR falls from the first position PO1 to the second position PO2. Also, the controller 180 may calculate the falling speed of the droplet DR based on a distance between the second position PO2 and the third position PO3, and a time taken when the droplet DR falls from the second position PO2 to the third position PO3. It is possible to calculate an average falling speed of the droplet DR by calculating an arithmetic mean of the calculated falling speeds.

The controller 180 may calculate the falling speed of the droplet DR by creating a virtual straight line through a connection between centers of the droplet DR at respective positions and connecting such a straight line to a point at which the droplet DR of the droplet discharger 140 is discharged. Also, the controller 180 may calculate the discharge angle of the droplet DR by determining, as the discharge angle of the droplet DR, an angle formed by the central line CL and the falling path of the droplet DR, and calculating the angle. According to some example embodiments, the controller 180 may determine, as the discharge angle of the droplet DR, an angle formed by the falling path of the droplet DR and an arbitrary straight line perpendicular to an end of the nozzle of the droplet discharger 140 from which the droplet DR is discharged.

As described above, the controller 180 may calculate the discharge angle and a path of the droplet DR of the droplet discharger 140 in each of the X-axis, Y-axis, and Z-axis directions. For example, as described above, the controller 180 may calculate an angle at which the droplet DR is discharged from the end of the nozzle of the droplet discharger 140 in the X-axis or Y-axis direction, based on each position of the first center CE1, the second center CE2, and the third center CE3 of the droplet DR. In particular, as described above, the controller 180 may calculate the discharge angle of the droplet DR and the falling path of the droplet DR by connecting the X and Y coordinates of the droplet DR with respect to the reference point.

Through the above processes, the controller 180 may calculate at least one of the 3D shape, the volume, the falling speed, the falling path, or the discharge angle of the droplet DR.

Then, as described above, the controller 180 may accurately control the droplet discharger 140 based on the above descriptions.

When the droplet DR is provided through the nozzle to the opening 19OP of a pixel-defining layer 19 described with reference to FIG. 18, the controller 180 may compare the measured volume of the droplet DR with a volume that is set in advance. When it is determined that the measured volume of the droplet DR is less than the volume that is set in advance, the controller 180 may control the droplet discharger 140 to enable an increase in an amount of droplets DR discharged from the droplet discharger 140 compared to an existing amount. On the contrary, when it is determined that the measured volume of the droplet DR is greater than the volume that is set in advance, the controller 180 may control the droplet discharger 140 to enable a decrease in the amount of droplets DR discharged from the droplet discharger 140 compared to the existing amount. Also, when the measured volume of the droplet DR is equal to the volume that is set in advance, the controller 180 may control the droplet discharger 140 to maintain a current state. In this case, when the volume, which set in advance, is a total amount of droplets DR to be provided to one opening 19OP of the pixel-defining layer 19, it is possible to adjust a time taken to discharge the droplet DR from the droplet discharger 140 according to the measured amount of droplets DR.

On the contrary, when the droplet DR is provided to the opening 19OP of the pixel-defining layer 19 through at least two nozzles, the controller 180 may calculate the volume of the droplet DR discharged from each nozzle. In this case, the controller 180 may control the droplet DR to be provided through at least one of the at least two nozzles so that the volume of the droplet DR corresponds to a total amount (e.g., a set or predefined total amount) of droplets DR to be provided to the opening 19OP of the pixel-defining layer 19. For example, the controller 180 may control the volume of the droplet DR discharged from one of the at least two nozzles to enable the volume corresponds to the total amount (e.g., the set or predefined total amount) of droplets DR, and may control other nozzles to stop working. According to some example embodiments, the controller 180 may respectively control the volumes of the droplets DR provided from at least two nozzles to enable the volumes to correspond to the total amount (e.g., the set or predefined total amount) of droplets DR. According to some example embodiments, it is possible to drive some of at least three nozzles and the others of at least three nozzles to enable the volumes to correspond to the total amount (e.g., the set or predefined total amount) of droplets DR. For example, when three nozzles provide the droplets DR to one opening 19OP of the pixel-defining layer, and when a total amount (e.g., a set or predefined total amount) of droplets DR to be provided to the opening 19OP of the pixel-defining layer 19 is 20 mm³, an amount of droplets DR discharged from one of three nozzles is 9 mm³, an amount of droplets DR discharged from another of the three nozzles is 10 mm³, and an amount of droplets DR discharged from the other of the three nozzles is 11 mm³, one and another of the three nozzles may be driven, and the other of the nozzles may not be driven. It is possible to accurately provide the amount (e.g., the set or predefined amount) of droplets DR to each opening 19OP of the pixel-defining layer 19. According to some example embodiments, when multiple nozzles are used, it is possible to match a total amount of droplets DR to be provided to one opening 19OP of the pixel-defining layer 19 with a value (e.g., a set or predefined value) by differently controlling times taken to discharge the droplets DR from respective nozzles.

The controller 180 may compare a calculated falling speed (or an average falling speed) of the droplet DR with a falling speed (e.g., a set or predefined falling speed). In this case, the controller 180 may control a movement speed of the display substrate S or the droplet discharger 140 according to the above falling speed. For example, when the calculated falling speed (or the average falling speed) of the droplet is less than the falling speed (e.g., the set or predefined falling speed), the controller 180 may control the moving speed of the display substrate S or the droplet discharger 140 faster than the moving speed (e.g., the set or predefined moving speed) when the droplet discharger 140 discharges the droplet DR to the display substrate S. On the contrary, when the calculated falling speed (or the average falling speed) of the droplet is greater than the falling speed (e.g., the set or predefined falling speed), the controller 180 may control the moving speed of the display substrate S or the droplet discharger 140 to be slower than the moving speed (e.g., the set or predefined moving speed) when the droplet discharger 140 discharges the droplet DR to the display substrate S. Therefore, through the above processes, the droplet may be discharged at an accurate position.

Referring to FIG. 9, when the droplet DR is discharged to the display substrate S and provided to the opening 19OP of the pixel-defining layer 19, the display substrate S or the droplet discharger 140 may be moved. In this case, the controller 180 may compare the falling path of the droplet DR with the falling path (e.g., the set or predefined falling path) as described above and may control the movement of the display substrate S or the droplet discharger 140.

For example, the controller 180 may compare the falling path of the droplet DR with the falling path (e.g., the set or predefined falling path). In this case, the controller 180 may calculate a falling path in a movement direction of the display substrate S or the droplet discharger 140 that is in the falling path of the droplet DR. According to the above falling path, the controller 180 may calculate a point of the display substrate S on which the droplet DR is provided. In particular, the controller 180 may determine whether the calculated point of the display substrate S, on which the droplet DR is provided, is in an arbitrary straight line that is parallel to the movement direction (e.g., the Y-axis direction) of the display substrate S or the droplet discharger 140 as the droplet DR passes through a point (e.g., a set or predefined point) $D_0$.

When it is determined that the calculated point of the droplet DR is in the arbitrary straight line, the controller 180 may compare the calculated point of the droplet DR with the point (e.g., the set or predefined point) $D_0$. For example, when the calculated point of the droplet DR is a first point $D_1$, the controller 180 may make the movement speed of the display substrate S or the droplet discharger 140 be less than the movement speed (e.g., the set or predefined movement speed). On the contrary, when the calculated point of the droplet DR is a second point $D_2$, the controller 180 may make the movement speed of the display substrate S or the droplet discharger 140 be greater than the movement speed (e.g., the set or predefined movement speed).

When it is determined that the calculated point of the droplet DR is not in the arbitrary straight line, the controller 180 may cleanse the droplet discharger 140. For example, when the calculated point of the droplet DR is a third point $D_3$ and a fourth point $D_4$, the controller 180 may cleanse the droplet discharger 140. According to some example embodiments, the controller 180 may adjust the location of the droplet discharger 140 by controlling the moving unit 130 to enable the calculated point of the droplet DR to be in the arbitrary straight line.

The controller 180 may compare the calculated discharge angle of the droplet DR with a discharge angle (e.g., a set or predefined discharge angle). In this case, the controller 180 may calculate the discharge angle of the droplet DR in each of the X-axis and Y-axis directions. As described above, when the calculated discharge angle of the droplet DR is in the X-axis direction instead of the movement direction of the display substrate S or the droplet discharger 140, the controller 180 may cleanse the droplet discharger 140. According to some example embodiments, the droplet discharger 140 may be cleansed by a brush or using a cleansing solution.

When the calculated discharge angle of the droplet DR is not in the X-axis direction instead of the movement direction of the display substrate S or the droplet discharger 140, the controller 180 may compare a discharge angle of the droplet DR, which is calculated in the Y-axis direction that is the movement direction of the display substrate S or the droplet discharger 140, with the discharge angle (e.g., the set or predefined discharge angle). In this case, when the calculated discharge angle of the droplet DR is a first discharge angle $\theta_1$, the controller 180 may control the movement speed of the display substrate S or the droplet discharger 140 to be less than the movement speed (e.g., the set or predefined movement speed). On the contrary, when the calculated discharge angle of the droplet DR is a second discharge angle $\theta_2$, the controller 180 may control the movement speed of the display substrate S or the droplet discharger 140 to be greater than the movement speed (e.g., the set or predefined movement speed). Therefore, under the above control, the droplet DR may be provided at an accurate position of the display substrate S according to the discharge angle of the droplet DR.

The above control may be separately or collectively performed. That is, when at least two of the 3D shape, the volume, the falling speed, the falling path, and the discharge angle of the droplet DR are different from set or predefined values, the controller 180 may collectively control each component of the apparatus for manufacturing a display device and thus may enable the accurate provision of the droplet DR to the display substrate S.

Figure 10:
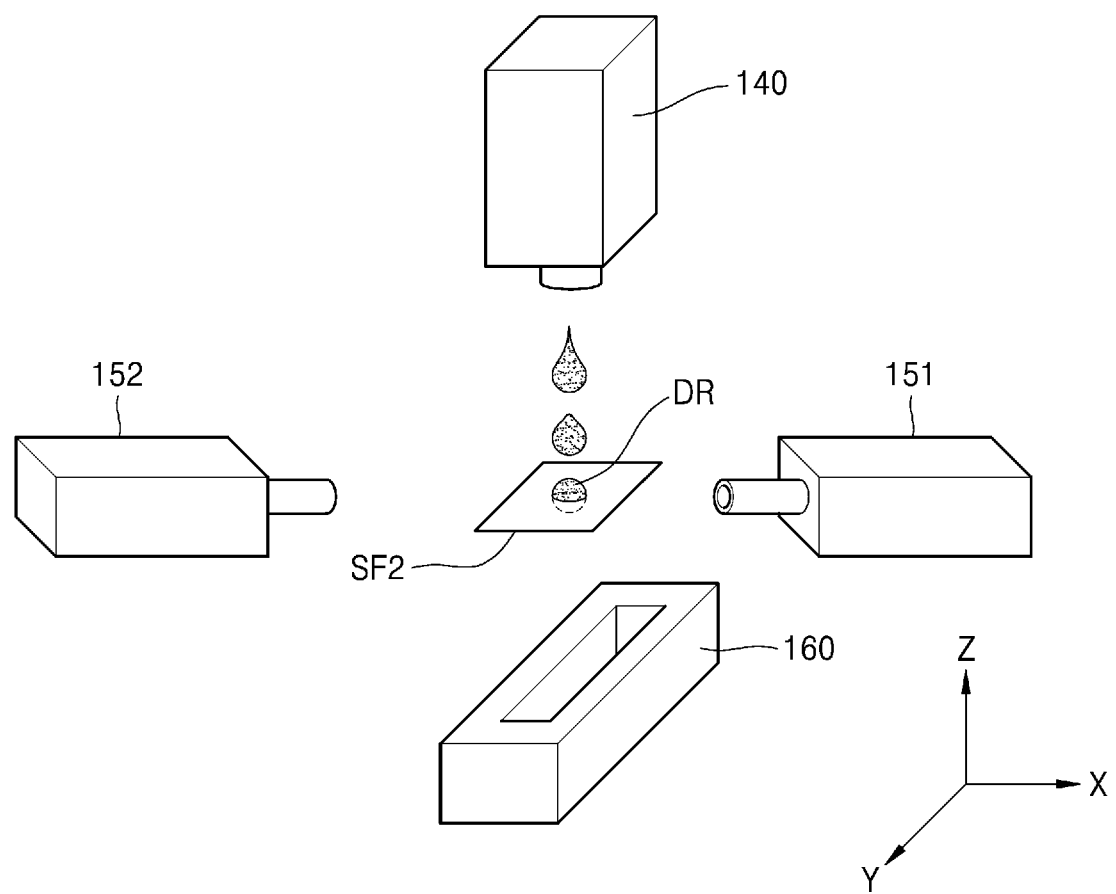
FIG. 10 is a schematic perspective view of part of an apparatus for manufacturing a display device, according to some example embodiments.
Figure 11:
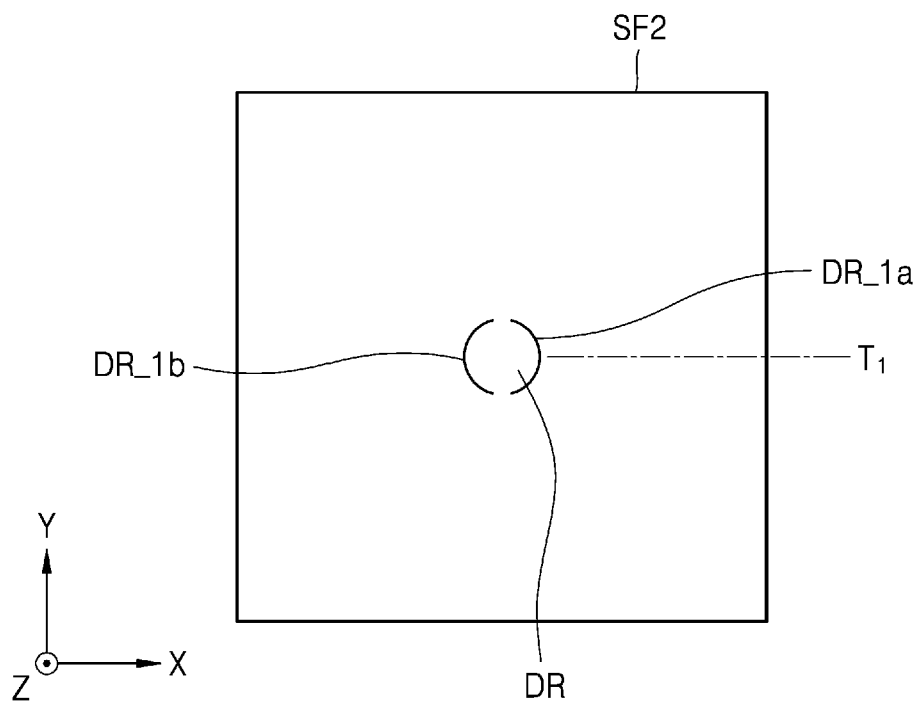
FIG. 11 is a schematic plan view of a partial shape of a droplet located at a first point in time of FIG. 10.
Figure 12:
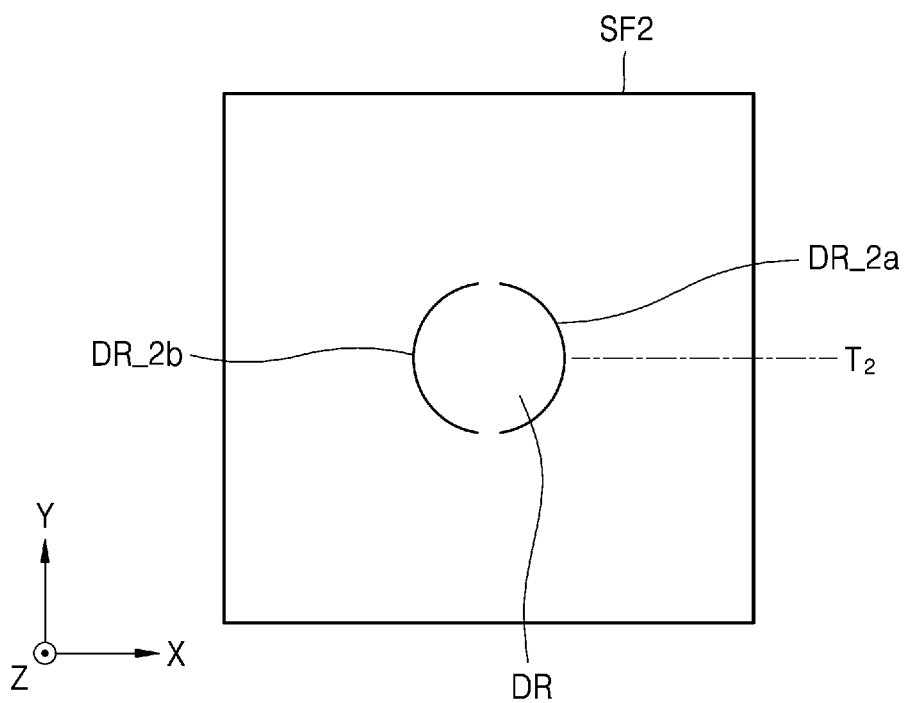
FIG. 12 is a schematic plan view of a partial shape of a droplet located at a second point in time of FIG. 10.
Figure 13:
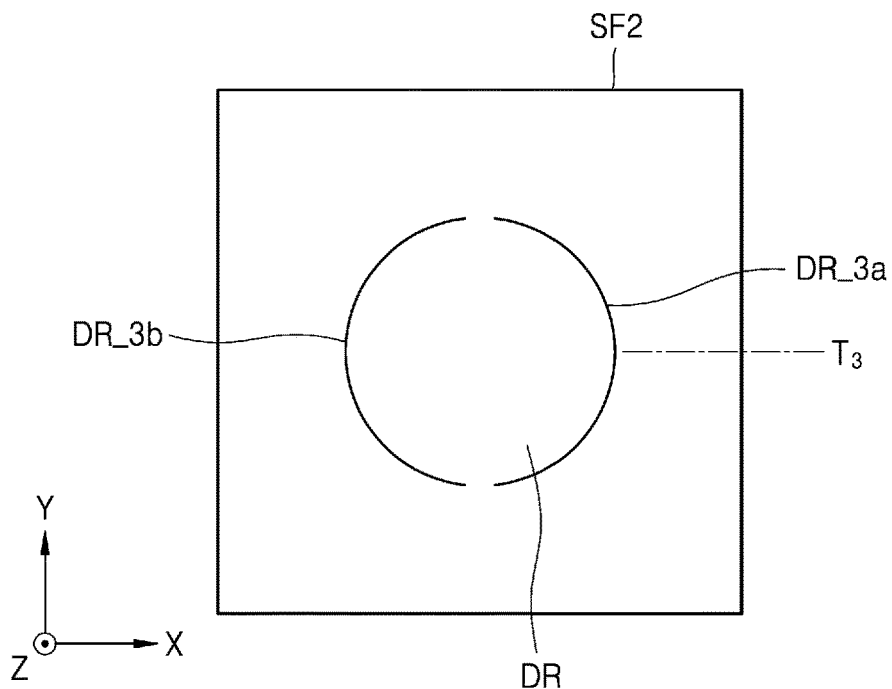
FIG. 13 is a schematic plan view of a partial shape of a droplet located at a third point in time of FIG. 10.

FIG. 10 is a schematic perspective view of part of an apparatus for manufacturing a display device, according to some example embodiments, FIG. 11 is a schematic plan view of a partial shape of a droplet located at a first point in time of FIG. 10, FIG. 12 is a schematic plan view of a partial shape of a droplet located at a second point in time of FIG. 10, and FIG. 13 is a schematic plan view of a partial shape of a droplet located at a third point in time of FIG. 10.

Referring to FIGS. 10 to 13, the first and second detectors 151 and 152 may detect part of a plane shape of the droplet DR by using laser that is irradiated onto an arbitrary second plane SF2, which is perpendicular to the falling path of the droplet DR, and reflected therefrom. In this case, based on detection results of the first and second detectors 151 and 152, the controller 180 may calculate a shape, in which the second plane SF2 overlaps the droplet DR, when the droplet DR passes through the arbitrary second plane SF2 that is perpendicular to the falling path of the droplet DR. In this case, the second plane SF2 may be parallel to the X-Y plane.

For example, a position of the droplet DR falling from the droplet discharger 140 may vary according to time. For example, when a first point in time $T_1$ has passed after the droplet DR falls from the droplet discharger 140, the droplet DR may have a long tail because of attraction to the nozzle of the droplet discharger 140. Also, when a second point in time $T_2$ has passed after the droplet DR falls from the droplet discharger 140, the droplet DR may have a shorter tail compared to the droplet DR in the first point in time $T_1$. When a third point in time $T_3$ has passed right after the droplet DR falls from the droplet discharger 140, the droplet DR may have a shorter tail compared to the droplet DR in the second point in time $T_2$. Thus, a shape of the droplet DR may be almost a sphere.

As described above, the first and second detectors 151 and 152 may detect the droplets DR in the first, second, and third points in time $T_1$, $T_2$, and $T_3$. In this case, a time interval, in which the droplets DR start falling from the droplet discharger 140, the first point in time $T_1$, an interval between the first point in time $T_1$ and the second point in time $T_2$, and an interval between the second point in time $T_2$ and the third point in time $T_3$, may be identical to each other. That is, the first and second detectors 151 and 152 may detect the droplets DR falling at certain time intervals. FIGS. 10 to 13 show that the first and second detectors 151 and 152 may detect the droplets DR in the first to third points in time $T_1$ to $T_3$, but one or more embodiments are not limited thereto. The first and second detectors 151 and 152 may detect the droplets for multiple points in time. For example, the first and second detectors 151 and 152 may detect the droplets DR from the first point in time to a tenth point in time, detect the droplets DR from the first point in time to a twentieth point in time, and detect the droplets DR from the first point in time to an $N^{th}$ point in time.

Referring to FIGS. 10 and 11, the first and second detectors 151 and 152 may detect a partial shape of the droplet DR when the first point in time $T_1$ comes after the droplet DR is discharged. In more detail, the first detector 151 may detect part of an outer surface DR_1a of the droplet DR located on the second plane SF2, and the second detector 152 may detect part of an outer surface DR_1b of the droplet DR located on the second plane SF2.

The outer surface DR_1a detected by the first detector 151 and the outer surface DR_1b of the droplet DR detected by the second detector 152 may be symmetrical to each other. According to some example embodiments, shapes of the outer surface DR_1a detected by the first detector 151 and the outer surface DR_1b of the droplet DR detected by the second detector 152 may be different from each other.

As described above with reference to FIG. 3, when an angle of the shape of the outer surface of the droplet DR is equal to or greater than a certain degree, the shape of the outer surface of the droplet DR may not be detected. Therefore, the controller 180 of the apparatus 100 according to some example embodiments may calculate the outer surface of the droplet DR by connecting portions other than the partial shapes of the outer surfaces DR_1a and DR_1b of the droplet DR detected by the first and second detectors 151 and 152. For example, the controller 180 may calculate the shape of the outer surface of the droplet DR by connecting portions, which are not detected by the first and second detectors 151 and 152 from among the partial shapes of the outer surfaces of the droplets DR, to each other. In this case, the portions, which are not detected by the first and second detectors 151 and 152 from among the partial shapes of the outer surfaces of the droplet DR, are connected to each other in a straight line or a curved line with respect to the center of the droplet DR. For example, the portions, which are not detected by the first and second detectors 151 and 152 from among the partial shapes of the outer surfaces of the droplet DR, may be connected in a curved line, and thus the shape of the outer surface of the droplet DR may be a circle.

Referring to FIGS. 10 and 12, the first and second detectors 151 and 152 may detect a partial shape of the outer surface of the droplet DR in the second point in time $T_2$ after the droplet DR is discharged. In more detail, the first detector 151 may detect part of an outer surface DR_2a of the droplet DR located on the second plane SF2, and the second detector 152 may detect part of an outer surface DR_2b of the droplet DR located on the second plane SF2.

As shown in FIG. 11, the controller 180 may calculate a shape of an outer surface of the droplet DR by connecting the portions that are not detected by the first and second detectors 151 and 152 from among the partial shapes of the outer surfaces of the droplet DR. In this case, the shape of the outer surface of the droplet DR in the second point in time $T_2$ may have a greater size of the shape of the outer surface of the droplet DR in the first point in time $T_1$.

Referring to FIGS. 10 and 13, the first and second detectors 151 and 152 may detect the partial shape of the outer surface of the droplet DR in the third point in time $T_3$ after the droplet DR is discharged. In more detail, the first detector 151 may detect a portion of an outer surface DR_3a of the droplet DR located on the second plane SF2, and the second detector 152 may detect a portion of an outer surface DR_3b of the droplet DR located on the second plane SF2.

Then, as shown in FIG. 11, the controller 180 may calculate the shape of the outer surface of the droplet DR by connecting the portions that are not detected by the first and second detectors 151 and 152 from among the partial shapes of the outer surface of the droplet DR. In this case, the shape of the outer surface of the droplet DR in the third point in time $T_3$ may have a greater size than the shape of the outer surface of the droplet DR in the first point in time $T_1$ or the second point in time $T_2$.

Figure 14:
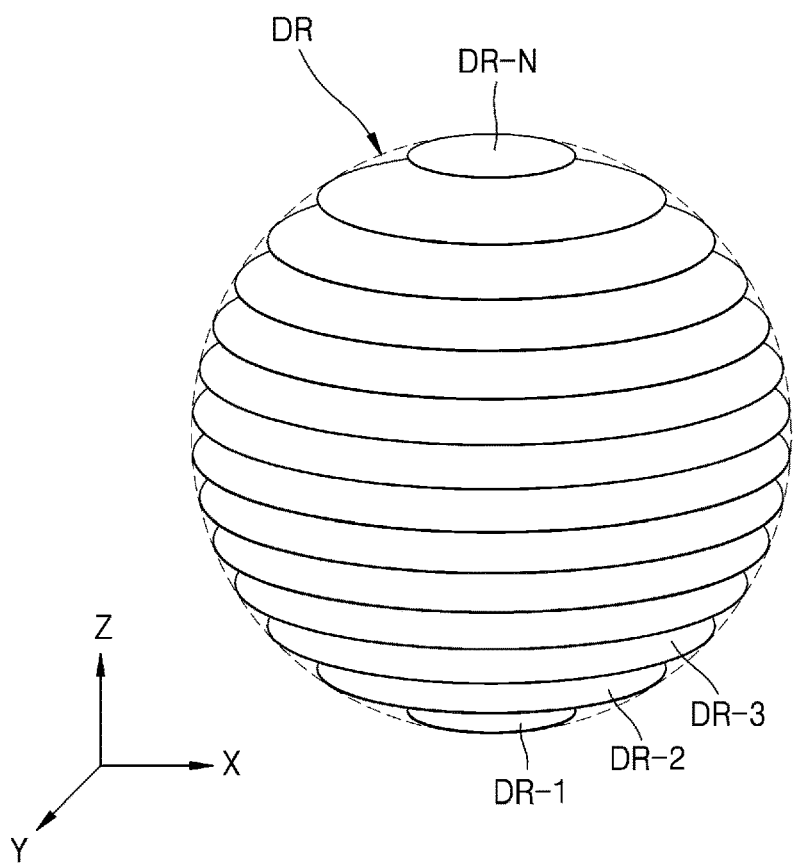
FIG. 14 is a schematic perspective view of planar shapes of droplets that are detected by using an apparatus for manufacturing a display device, according to some example embodiments.

FIG. 14 is a schematic perspective view of planar shapes of droplets that are detected by using an apparatus for manufacturing a display device, according to some example embodiments.

Referring to FIGS. 10 to 14, based on detection results of the first and second detectors 151 and 152, the controller 180 may calculate the shape of the outer surface of the droplet DR on the second plane SF2 according to time when the droplet DR passes through the arbitrary second plane SF2 that is perpendicular to the falling path of the droplet DR, and may calculate a 3D shape of the droplet DR by overlapping the calculated outer surfaces of the droplet DR.

In more detail, the first and second detectors 151 and 152 may detect the partial shapes of the outer surfaces of the droplet DR in the first point in time $T_1$, the controller 180 may calculate a first outer shape DR-1 of the droplet in the first point in time $T_1$ by connecting the detected partial shapes of the outer surface of the droplet DR. The first and second detectors 151 and 152 may detect the partial shapes of the outer surfaces of the droplet DR in the second point in time $T_2$, the controller 180 may calculate a second outer shape DR-2 of the droplet in the second point in time $T_2$ by connecting the detected partial shapes of the outer surface of the droplet DR. The first and second detectors 151 and 152 may detect the partial shapes of the outer surfaces of the droplet DR in the third point in time $T_3$, the controller 180 may calculate a third outer shape DR-3 of the droplet in the third point in time $T_3$ by connecting the detected partial shapes of the outer surface of the droplet DR.

As described above, the first and second detectors 151 and 152 may detect the partial shapes of the outer surfaces of the droplet DR in the $N^{th}$ point in time $T_N$, the controller 180 may calculate a $N^{th}$ outer shape DR-N of the droplet in the $N^{th}$ point in time $T_N$ by connecting the detected partial shapes of the outer surface of the droplet DR, where N is a natural number. After the droplet DR is discharged, as time passes, the calculated shape of the outer surface of the droplet may increase and then decrease.

The controller 180 may calculate the 3D shape of the droplet DR as the calculated first to $N^{th}$ outer shapes DR-1 to DR-N are stacked in a direction in which the droplet DR is discharged as shown in FIG. 14 and are connected to each other. The controller 180 may calculate the volume of the droplet DR by using the calculated 3D shape.

Based on the volume of the droplet DR calculated as described above, the controller 180 may control an amount of droplets DR discharged from the droplet discharger 140. Alternatively, based on the calculated volume of the droplet DR, the controller 180 may determine which nozzles have to be driven from among at least two nozzles of the droplet discharger 140. Also, the controller 180 may control the total amount of droplets DR provided to the display substrate S by controlling the discharge speed of the droplet discharger 140.

Therefore, the apparatus for manufacturing a display device may adjust the droplet DR provided to the display substrate S.

Figure 15:
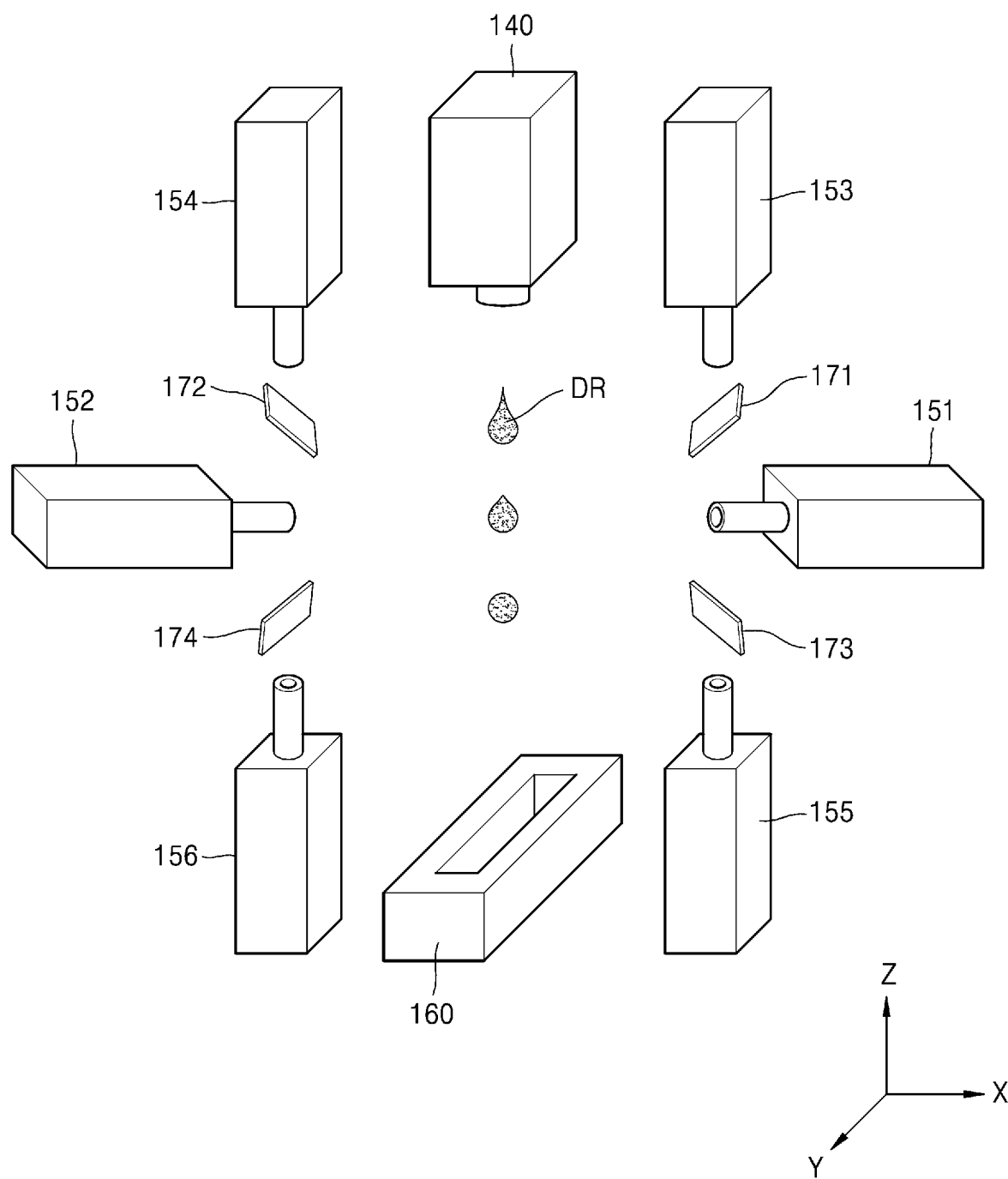
FIG. 15 is a schematic perspective view of part of an apparatus for manufacturing a display device, according to some example embodiments.

FIG. 15 is a schematic perspective view of part of an apparatus for manufacturing a display device, according to some example embodiments. The embodiment of FIG. 15 differs from that of FIG. 2 in that third to sixth detectors 153 to 156 are further included in addition to the first and second detectors 151 and 152. Because like reference numerals in FIGS. 2 and 15 denote like elements, the descriptions already provided may not be provided again, and a difference therebetween will be mainly described.

Referring to FIG. 15, the first and second detectors 151 and 152 may be arranged opposite to each other. The first and second detectors 151 and 152 may be arranged in different directions with respect to the falling path of the droplet DR. That is, the first and second detectors 151 and 152 may be apart from each other in the X direction perpendicular to the Z direction in which the droplet DR falls.

The third and fifth detectors 153 and 155 may be aligned to be apart from the first detector 151 along the falling path of the droplet DR. That is, the third and fifth detectors 153 and 155 may be apart from the first detector 151 in the Z direction in which the droplet DR falls. The fourth and sixth detectors 154 and 156 may be aligned to be apart from the second detector 152 along the falling path of the droplet DR. That is, the fourth and sixth detectors 154 and 156 may be apart from the second detector 152 in the Z direction in which the droplet DR falls. For example, the fourth detector 154 may be arranged across the third detector 153, and the sixth detector 156 may be arranged across the fifth detector 155.

The third and fourth detectors 153 and 154 may detect droplets DR passing through the same area, the first and second detectors 151 and 152 may detect droplets DR passing through the same area, and the fifth and sixth detectors 155 and 156 may detect droplets DR passing through the same area. In this case, the area detected by the third and fourth detectors 153 and 154, the area detected by the first and second detectors 151 and 152, and the area detected by the fifth and sixth detectors 155 and 156 may be different from each other or may be continuous or separate from each other.

When the first to sixth detectors 151 and 156 are arranged as described above, a first reflector 171 may be located corresponding to the third detector 153, a second reflector 172 may be located corresponding to the fourth detector 154, a third reflector 173 may be located corresponding to the fifth detector 155, and a fourth reflector 174 may be located corresponding to the sixth detector 156.

The first to fourth reflectors 171 to 174 may respectively guide, to the falling path of the droplet DR, laser beams emitted from the third to sixth detectors 153 to 156, etc. For example, the first to fourth reflectors 171 to 174 may be of a mirror type.

The apparatus for manufacturing a display device according to some example embodiments may accurately and precisely detect the droplet DR discharged from the droplet discharger 140 by using the first to sixth detectors 151 to 156.

Figure 16:
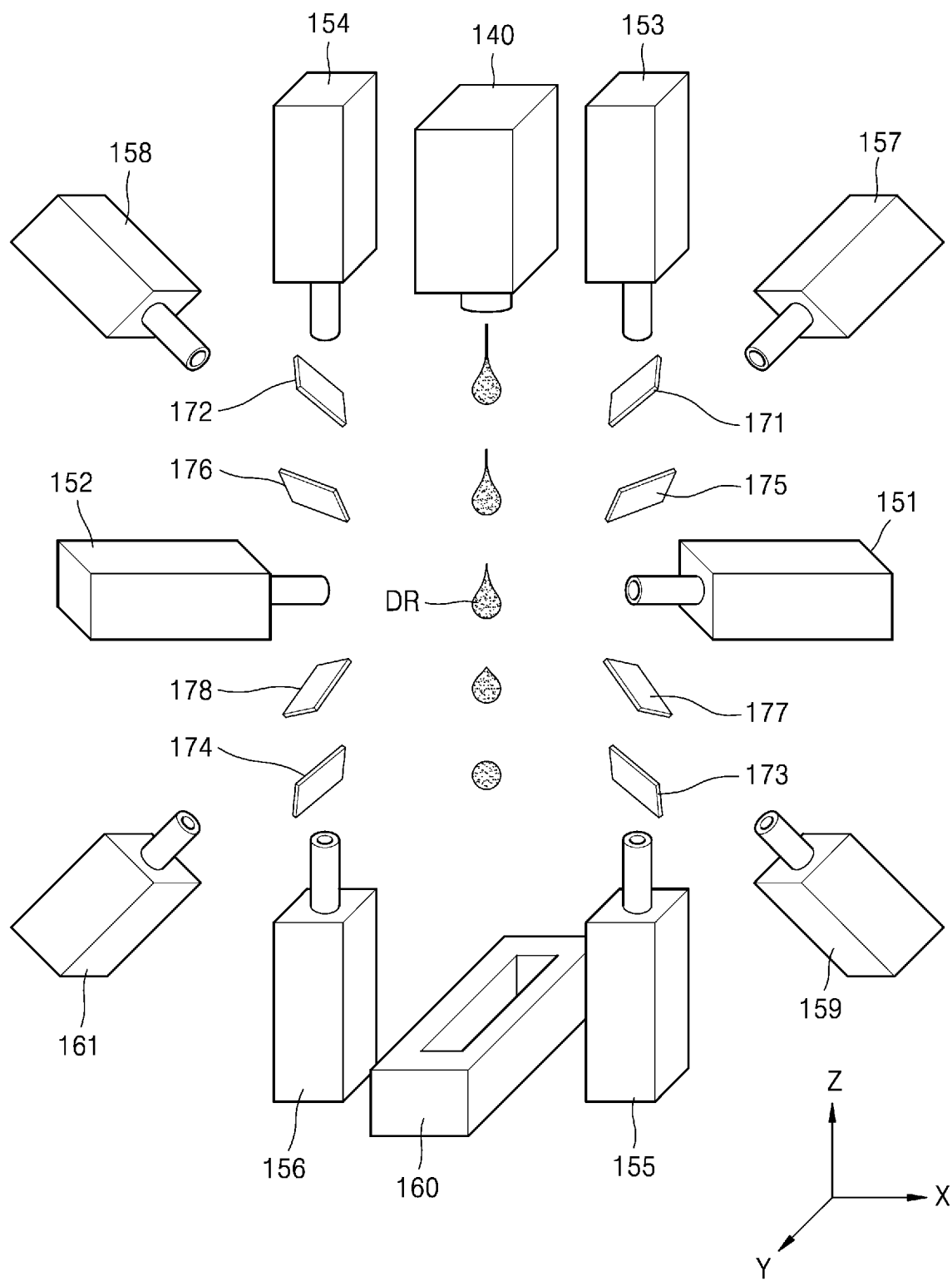
FIG. 16 is a schematic perspective view of part of an apparatus for manufacturing a display device, according to some example embodiments.

FIG. 16 is a schematic perspective view of part of an apparatus for manufacturing a display device, according to some example embodiments. The embodiment of FIG. 16 differs from that of FIG. 15 in that seventh, eighth, ninth, and tenth detectors 157, 158, 159, and 161 in addition to the first to sixth detectors 151 to 156. Because like reference numerals in FIGS. 15 and 16 denote like elements, the descriptions already provided may not be provided again, and a difference therebetween will be mainly described.

Referring to FIG. 16, the seventh and eighth detectors 157 and 158 may be arranged on the falling path of the droplet DR falling from the droplet discharger 140, but may be arranged in opposite directions with respect to the falling path of the droplet DR. The seventh and eighth detectors 157 and 158 may be spaced apart from each other in the X direction perpendicular to the Z direction in which the droplet DR falls. For example, the eighth detector 158 may be arranged across the seventh detector 157.

The ninth and tenth detectors 159 and 161 may be in the falling path of the droplet DR falling from the droplet discharger 140, but may be arranged in opposite directions with respect to the falling path of the droplet DR. The ninth and tenth detectors 159 and 161 may be spaced apart from each other in the X direction perpendicular to the Z direction in which the droplet DR falls. For example, the ninth detector 159 may be arranged across the tenth detector 161.

The third and fourth detectors 153 and 154 may detect droplets DR passing through the same area, the seventh and eighth detectors 157 and 158 may detect droplets DR passing through the same area, and the first and second detectors 151 and 152 may detect droplets DR passing through the same area. Also, the ninth and tenth detectors 159 and 161 may detect droplets DR passing through the same area, and the fifth and sixth detectors 155 and 156 may detect droplets DR passing through the same area. In this case, the area detected by the third and fourth detectors 153 and 154, the area detected by the seventh and eighth detectors 157 and 158, the area detected by the first and second detectors 151 and 152, the area detected by the ninth and tenth detectors 159 and 161, and the area detected by the fifth and sixth detectors 155 and 156 may be different from each other or may be continuous or separate from each other.

When the seventh to tenth detectors 161 are arranged as described above, a fifth reflector 175 may be located corresponding to the seventh detector 157, a sixth reflector 176 may be located corresponding to the eighth detector 158, a seventh reflector 177 may be located corresponding to the ninth detector 159, and an eighth reflector 178 may be located corresponding to the tenth detector 161.

The fifth to eighth reflectors 175 to 178 may respectively guide, to the falling path of the droplet DR, laser beams emitted from the seventh to tenth detectors 157 to 161, etc. For example, the fifth to eighth reflectors 175 to 178 may be of a mirror type.

The apparatus for manufacturing a display device according to some example embodiments may accurately and precisely detect the droplet DR discharged from the droplet discharger 140 by using the first to tenth detectors 151 to 161.

Figure 17:
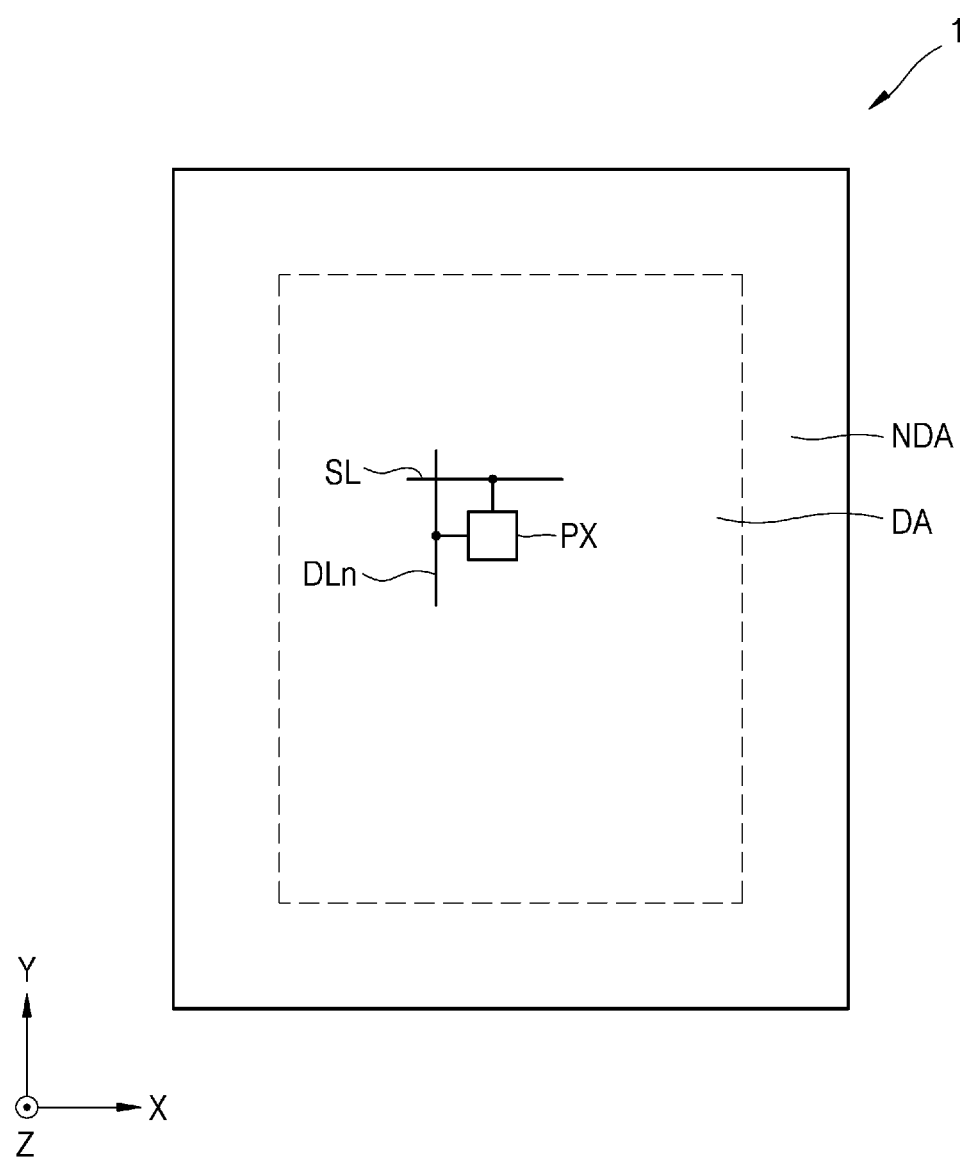
FIG. 17 is a schematic plan view of a display device manufactured by using an apparatus of a manufacturing a display device, according to some example embodiments.
Figure 18:
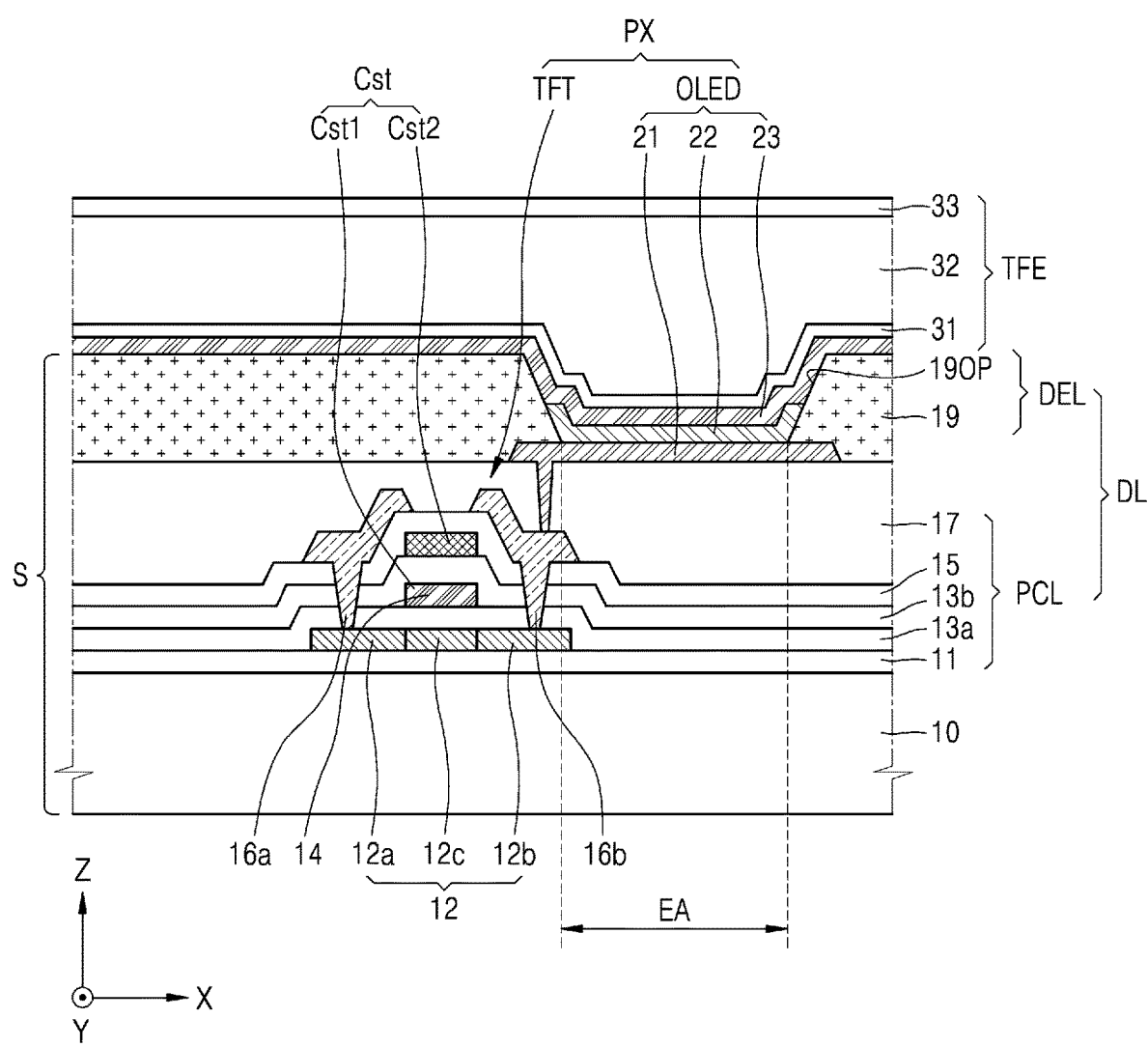
FIG. 18 is a schematic cross-sectional view of a display device manufactured by using an apparatus of a manufacturing a display device, according to some example embodiments.

FIG. 17 is a schematic plan view of a display device manufactured by using an apparatus of a manufacturing a display device, according to some example embodiments, and FIG. 18 is a schematic cross-sectional view of a display device manufactured by using an apparatus of a manufacturing a display device, according to some example embodiments.

Referring to FIGS. 17 and 18, the display device 1 may include the display substrate S. The display substrate S may include a substrate 10, an intermediate layer of a display layer DL, and a layer excluding a common electrode 23.

The display layer DL and a thin film encapsulation layer TFE may be located on the substrate 10. The display layer DL may include a pixel circuit layer PCL and a display element layer DEL.

The substrate 10 may include glass or polymer resin such as polyether sulfone, polyarylate, polyether imide, polyethylene naphthalate, polyethylene terephthalate, polyphenylene sulfide, polyimide, PC, TAC, or cellulose acetate propionate.

A barrier layer may be further located between the display layer DL and the substrate 10. The barrier layer may prevent the penetration of external impurities and may be a layer or layers including an inorganic material such as silicon nitride ($SiN_x$, x>0) or silicon oxide ($SiO_x$, x>0).

The pixel circuit layer PCL may be located on the substrate 10. The pixel circuit layer PCL may include a thin film transistor TFT, a buffer layer 11 located under and/or on elements of the thin film transistor TFT, a first insulating layer 13a, a second insulating layer 13b, a third insulating layer 15, and a planarization layer 17.

The buffer layer 11 may include an inorganic insulating material such as $SiN_x$, silicon oxynitride (SiON), or $SiO_x$, and may be a layer or layers including the above inorganic insulating material(s).

The thin film transistor TFT may include a semiconductor layer 12, and the semiconductor layer 12 may include polysilicon. Alternatively, the semiconductor layer 12 may include amorphous silicon, an oxide semiconductor, an organic semiconductor, or the like. The semiconductor layer 12 may include a channel area 12c and a drain area 12a and a source area 12b that are located on both sides of the channel area 12c. A gate electrode 14 may overlap the channel area 12c.

The gate electrode 14 may include a low-resistive metallic material. The gate electrode 14 may include a conductive material including molybdenum (Mo), aluminum (Al), copper (Cu), or titanium (Ti) and may be a layer or layers including the above material(s).

A first insulating layer 13a between the semiconductor layer 12 and the gate electrode 14 may include an inorganic insulating material such as $SiO_2$, $SiN_x$, SiON, aluminum oxide ($Al_2O_3$), titanium oxide ($TiO_2$), tantalum oxide ($Ta_2O_5$), or hafnium oxide ($HfO_2$), or zinc oxide ($ZnO_2$).

The second insulating layer 13b may cover the gate electrode 14. Similar to the first insulating layer 13a, the second insulating layer 13b may include $SiO_2$, $SiN_x$, SiON, $Al_2O_3$, $TiO_2$, $Ta_2O_5$, $HfO_2$, or $ZnO_2$.

On the second insulating layer 13b, an upper electrode Cst2 of a storage capacitor Cst may be located. The upper electrode Cst2 may overlap the gate electrode 14 thereunder. In this case, the gate electrode 14 and the upper electrode Cst2, which overlap each other with the second insulating layer 13b therebetween, may form the storage capacitor Cst. That is, the gate electrode 14 may function as a lower electrode Cst1 of the storage capacitor Cst.

As described, the storage capacitor Cst and the thin film transistor TFT may overlap. In some embodiments, the storage capacitor Cst may not overlap the thin film transistor TFT.

The upper electrode Cst2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu) and may be a layer or layers including the above material(s).

The third insulating layer 15 may cover the upper electrode Cst2. The third insulating layer 15 may include $SiO_2$, SiNx, SiON, $Al_2O_3$, $TiO_2$, $Ta_2O_5$, $HfO_2$, $ZnO_2$, or the like. The third insulating layer 15 may be a layer or layers including the aforementioned inorganic insulating material.

A drain electrode 16a and a source electrode 16b may each be located on the third insulating layer 15. The drain electrode 16a and the source electrode 16b may include materials having good conductivity. The drain electrode 16a and the source electrode 16b may include conductive materials such as Mo, Al, Cu, and Ti and may be layers or a layer including the above material(s). According to some example embodiments, the drain electrode 16a and the source electrode 16b may have a multilayered structure of Ti/Al/Ti.

A planarization layer 17 may include an organic insulating layer. The planarization layer 17 may include organic materials such as a general-purpose polymer such as polymethylmethacrylate (PMMA) or polystyrene (PS), a polymer derivative having a phenol-based group, or an acryl-based polymer, an imide-based polymer, an aryl-ether-based polymer, an amide-based polymer, a fluorine-based polymer, a p-xylene-based polymer, a vinyl alcohol-based polymer, and a blend thereof.

On the pixel circuit layer PCL having the above structure, a display element layer DEL may be located. The display element layer DEL may include an organic light-emitting diode OLED, and the pixel electrode 21 of the organic light-emitting diode OLED may be electrically connected to the thin film transistor TFT through a contact hole defined in the planarization layer 17.

The pixel PX may include the organic light-emitting diode OLED and the thin film transistor TFT. Each pixel PX may emit, for example, red light, green light, or blue light from the organic light-emitting diode OLED or may emit red light, green light, blue light, or white light.

The pixel electrode 21 may include conductive oxide such as indium tin oxide (ITO), indium zinc oxide (IZO), zinc oxide (ZnO), indium oxide ($In_2O_3$), indium gallium oxide (IGO), or aluminum zinc oxide (AZO). According to some example embodiments, the pixel electrode 21 may include a reflective layer including Ag, Mg, Al, Pt, Pd, Au, Ni, Nd, Ir, Cr, or a compound thereof. According to some example embodiments, the pixel electrode 21 may further include a layer including ITO, IZO, ZnO, or $In_2O_3$ on/under the above reflective layer.

On the pixel electrode 21, the pixel-defining layer 19 having the opening 19OP exposing a central portion of the pixel electrode 21 may be located. The pixel-defining layer 19 may include an organic insulating material and/or an inorganic insulating material. The opening 19OP may define an emission area of light (hereinafter, referred to as the emission area, EA) emitted from the organic light-emitting diode OLED. For example, a width of the opening 19OP may correspond to a width of the emission area EA.

The emission layer 22 may be located in the opening 19OP of the pixel-defining layer 19. The emission layer 22 may include a high-molecular weight organic material or a low-molecular weight organic material emitting light of a certain color. According to some example embodiments, the emission layer 22 may include a quantum-dot material. The emission layer 22 may be formed as the apparatus for manufacturing a display device discharges the droplets.

According to some example embodiments, a first functional layer and a second functional layer may be located on and under the emission layer 22. The first functional layer may include, for example, a hole transport layer (HTL) or include an HTL and a hole injection layer (HIL). The second functional layer is an element located on the emission layer 22 and according to some example embodiments may be omitted. The second functional layer may include an electron transport layer (ETL) and/or an electron injection layer (EIL). The first functional layer and/or the second functional layer may be common layers that entirely cover the substrate 10 as the common electrode 23 described below entirely covers the substrate 10.

The common electrode 23 may include a conductive material having a low work function. For example, the common electrode 23 may include a transparent (translucent) layer including Ag, Mg, Al, Pt, Pd, Au, Ni, Nd, Ir, Cr, Li, Ca, or an alloy thereof. Alternatively, the common electrode 23 may further include a layer including ITO, IZO, ZnO, or $In_2O_3$ on the transparent (translucent) layer including the above material(s).

The thin film encapsulation layer TFE may be located on the common electrode 23. According to some example embodiments, the thin film encapsulation layer TFE includes at least one inorganic encapsulation layer and at least one organic encapsulation layer, and according to some example embodiments, FIG. 18 shows that the thin film encapsulation layer TFE includes a first inorganic encapsulation layer 31, an organic encapsulation layer 32, and a second inorganic encapsulation layer 33 that are sequentially stacked.

The first inorganic encapsulation layer 31 and a second inorganic encapsulation layer 33 may include at least one inorganic material selected from the group consisting of $Al_2O_3$, $TiO_2$, $Ta_2O_5$, $HfO_2$, $ZnO_2$, $SiO_2$, $SiN_x$, or SiON. The organic encapsulation layer 32 may include a polymer-based material. The polymer-based material may include acryl-based resin, epoxy-based resin, polyimide, polyethylene, and the like. According to some example embodiments, the organic encapsulation layer 32 may include acrylate.

According to some example embodiments, the thin film encapsulation layer TFE may have a structure in which the substrate 10 and a transparent upper substrate are coupled by a sealing member and thus an internal space between the substrate 10 and the upper substrate is sealed. In this case, a moisture absorbent, a filler, or the like may be located in an internal space. A sealing member may be a sealant, and according to some example embodiments, the sealing member may include a material hardened by laser. For example, the sealing member may be frit. For example, the sealing member may include urethane-based resin such as an organic sealant, epoxy-based resin, acryl-based resin, silicon that is an inorganic sealant, or the like. The urethane-based resin may include, for example, urethane acrylate, or the like. The acryl-based resin may include, for example, butyl acrylate, ethylhexyl acrylate, or the like. The sealing member may include a material hardened by heat.

According to some example embodiments, as the droplets discharged from the droplet discharger are detected by using the detectors, shapes, volumes, discharge angles, discharge speeds, and the like of the droplets may be accurately measured or calculated.

Also, according to some example embodiments, the droplets discharged from the droplet discharger may be detected by the detectors in the air.

Also, according to some example embodiments, as outer surfaces of the droplets are calculated by using shapes of outer surfaces of the droplets that are not detected by the detectors, the shapes, volumes, discharge angles, discharge speeds, and the like of the droplets may be accurately measured or calculated.

According to one or more embodiments, a display device capable of accurately and precisely measuring droplets in real time and providing a delicate image may be realized. However, the scope of the disclosure is not limited by the effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims and their equivalents.

What is claimed is:

1. An apparatus for manufacturing a display device, the apparatus comprising:
    a droplet discharger comprising a nozzle configured to discharge a droplet;

a first detector on a falling path of the droplet that falls from the droplet discharger and configured to detect a shape of the droplet;

a second detector spaced apart from the first detector and configured to detect the shape of the droplet that falls from the droplet discharger; and a controller configured to calculate at least one of a volume of the droplet, a falling speed of the droplet, the falling path of the droplet, or a discharge angle, at which the droplet is discharged from the nozzle, based on results detected by the first detector and the second detector.

2. The apparatus of claim 1, wherein the first detector and the second detector each comprise a confocal microscopy or a chromatic confocal line sensor.

3. The apparatus of claim 1, wherein the first detector and the second detector are arranged in opposite directions with respect to the falling path of the droplet.

4. The apparatus of claim 1, wherein the first detector and the second detector are configured to detect a partial shape of an outer surface of the droplet, which falls from the droplet discharger, at certain time intervals.

5. The apparatus of claim 4, wherein the first detector and the second detector are configured to detect a partial shape of an outer surface of the droplet that is reflected to an arbitrary plane.

6. The apparatus of claim 5, wherein the controller is configured to calculate an outer surface of the droplet by connecting portions other than the partial shape of the outer surface of the droplet detected by the first detector and the second detector.

7. The apparatus of claim 6, wherein the controller is configured to calculate a three-dimensional shape of the droplet by rotating the outer surface of the calculated shape of the droplet relative to the falling path of the droplet and to calculate a volume of the droplet by using the three-dimensional shape of the droplet.

8. The apparatus of claim 7, wherein the controller is configured to calculate a center of the droplet by using the three-dimensional shape of the droplet.

9. The apparatus of claim 1, further comprising:
a third detector spaced apart from the first detector along the falling path of the droplet; and
a fourth detector arranged opposite to the third detector with respect to the falling path of the droplet.

10. The apparatus of claim 9, further comprising:
a first reflector corresponding to the third detector and configured to bend laser emitted from the third detector and bend light reflected from the droplet; and
a second reflector corresponding to the fourth detector and configured to bend laser emitted from the fourth detector and bend the light reflected from the droplet.

11. The apparatus of claim 1, wherein the first detector and the second detector are configured to detect the droplet at certain time intervals, and the controller is configured to calculate the falling path of the droplet or a discharge angle of the droplet by connecting a center of the droplet detected by the first detector and the second detector.

12. The apparatus of claim 1, wherein the first detector and the second detector are configured to detect the droplet at certain time intervals when one droplet falls, and the controller is configured to calculate a falling speed of the droplet based on a distance in which the droplet moves for a certain point in time.

13. The apparatus of claim 1, further comprising an accommodation unit configured to house a droplet discharged from the nozzle.

14. An apparatus for manufacturing a display device, the apparatus comprising:
a droplet discharger comprising a nozzle configured to discharge a droplet;
a plurality of detectors on a falling path of the droplet that falls from the droplet discharger; and
a controller configured to calculate at least one of a volume of the droplet, a falling speed of the droplet, the falling path of the droplet, or a discharge angle, at which the droplet is discharged from the nozzle, based on a detection result of the plurality of detectors,
wherein the plurality of detectors are configured to detect a partial shape of the droplet falling from the droplet discharger at certain time intervals.

15. The apparatus of claim 14, wherein the plurality of detectors each comprise:
a first detector in the falling path of the droplet falling from the droplet discharger and configured to detect a shape of the droplet; and
a second detector opposite to the first detector with respect to the falling path of the droplet and configured to detect a shape of the droplet falling from the droplet discharger.

16. The apparatus of claim 15, wherein the plurality of detectors further comprise:
a third detector spaced apart from the first detector along the falling path of the droplet; and
a fourth detector opposite to the third detector with respect to the falling path of the droplet.

17. The apparatus of claim 16, further comprising:
a first reflector corresponding to the third detector and configured to bend laser emitted from the third detector and bend light reflected from the droplet; and
a second reflector corresponding to the fourth detector and configured to bend laser emitted from the fourth detector and bend the light reflected from the droplet.

18. The apparatus of claim 14, wherein the plurality of detectors further comprise a confocal microscopy or a chromatic confocal line sensor.

19. The apparatus of claim 14, wherein the controller is configured to calculate an outer surface of the droplet by connecting portions other than the partial shape of the outer surface of the droplet detected by the plurality of detectors, calculate a three-dimensional shape of the droplet by rotating the calculated outer surface of the droplet with respect to the falling path of the droplet, and calculate a volume of the droplet by using the three-dimensional shape of the droplet.

* * * * *